US011573077B2

(12) United States Patent
Chouaib et al.

(10) Patent No.: US 11,573,077 B2
(45) Date of Patent: Feb. 7, 2023

(54) SCATTEROMETRY BASED METHODS AND SYSTEMS FOR MEASUREMENT OF STRAIN IN SEMICONDUCTOR STRUCTURES

(71) Applicant: KLA Corporation, Milpitas, CA (US)

(72) Inventors: Houssam Chouaib, Milpitas, CA (US); Aaron Rosenberg, San Jose, CA (US); Kai-Hsiang Lin, Hillsboro, CA (US); Dawei Hu, Shanghai (CN); Zhengquan Tan, Cupertino, CA (US)

(73) Assignee: KLA Corporation, Milpitas, CA (US)

( * ) Notice: Subject to any disclaimer, the term of this patent is extended or adjusted under 35 U.S.C. 154(b) by 0 days.

(21) Appl. No.: 17/338,449

(22) Filed: Jun. 3, 2021

(65) Prior Publication Data

US 2021/0293532 A1 Sep. 23, 2021

Related U.S. Application Data

(63) Continuation of application No. 16/660,492, filed on Oct. 22, 2019, now Pat. No. 11,060,846.

(Continued)

(51) Int. Cl.

*G01B 11/06* (2006.01)
*H01L 21/66* (2006.01)

(Continued)

(52) U.S. Cl.

CPC ........ *G01B 11/0641* (2013.01); *G01B 11/165* (2013.01); *G01B 11/168* (2013.01);

(Continued)

(58) Field of Classification Search

CPC . G01B 11/0641; G01B 11/165; G01B 11/168; G01L 1/241; G01N 21/956;

(Continued)

(56) References Cited

U.S. PATENT DOCUMENTS 5,608,526 A 3/1997 Piwonka-Corle et al.
5,859,424 A 1/1999 Norton et al.

(Continued)

FOREIGN PATENT DOCUMENTS

WO 2007019023 A1 2/2007

OTHER PUBLICATIONS

Schlaf, R., et al., "Work function measurements on Indium Tin Oxide films," J. of Electron Spectr. and Related Phenomena 120, 149 (201).

(Continued)

*Primary Examiner* — Hung V Nguyen
(74) *Attorney, Agent, or Firm* — Spano Law Group; Joseph S. Spano

(57) ABSTRACT

Methods and systems for measuring optical properties of transistor channel structures and linking the optical properties to the state of strain are presented herein. Optical scatterometry measurements of strain are performed on metrology targets that closely mimic partially manufactured, real device structures. In one aspect, optical scatterometry is employed to measure uniaxial strain in a semiconductor channel based on differences in measured spectra along and across the semiconductor channel. In a further aspect, the effect of strain on measured spectra is decorrelated from other contributors, such as the geometry and material properties of structures captured in the measurement. In another aspect, measurements are performed on a metrology target pair including a strained metrology target and a corresponding unstrained metrology target to resolve the geometry of the metrology target under measurement and to provide a reference for the estimation of the absolute value of strain.

7 Claims, 10 Drawing Sheets

Related U.S. Application Data

(60) Provisional application No. 62/782,026, filed on Dec. 19, 2018.

(51) Int. Cl.

| | |
|---|---|
| ***G01N 21/956*** | (2006.01) |
| ***H01L 29/10*** | (2006.01) |
| ***G03F 7/20*** | (2006.01) |
| ***G01B 11/16*** | (2006.01) |
| ***G01L 1/24*** | (2006.01) |

(52) U.S. Cl.
CPC ............ *G01L 1/241* (2013.01); *G01N 21/956* (2013.01); *G03F 7/70616* (2013.01); *G03F 7/70625* (2013.01); *H01L 22/12* (2013.01); *H01L 29/1054* (2013.01); *G01B 2210/56* (2013.01)

(58) Field of Classification Search
CPC . G03F 7/70616; G03F 7/70625; H01L 22/12; H01L 29/1054
See application file for complete search history.

(56) References Cited

U.S. PATENT DOCUMENTS

| | | | | |
|---|---|---|---|---|
| 6,429,943 | B1 | 8/2002 | Opsal et al. | |
| 6,633,831 | B2 | 10/2003 | Nikoonahad et al. | |
| 6,734,967 | B1 | 5/2004 | Piwonka-Corle et al. | |
| 6,816,570 | B2 | 10/2004 | Janik et al. | |
| 6,895,075 | B2 | 5/2005 | Yokhin et al. | |
| 6,972,852 | B2 | 12/2005 | Opsal et al. | |
| 7,478,019 | B2 | 1/2009 | Zangooie et al. | |
| 7,755,764 | B2 | 7/2010 | Kwak et al. | |
| 7,826,071 | B2 | 11/2010 | Shchegrov et al. | |
| 7,907,264 | B1 | 3/2011 | Krishnan | |
| 7,929,667 | B1 | 4/2011 | Zhuang et al. | |
| 7,933,026 | B2 | 4/2011 | Opsal et al. | |
| 7,951,672 | B2 * | 5/2011 | Wack | G01B 11/245 438/257 |
| 8,749,179 | B2 | 6/2014 | Liu et al. | |
| 8,853,805 | B2 | 10/2014 | Chung et al. | |
| 8,860,937 | B1 | 10/2014 | Dziura et al. | |
| 8,879,073 | B2 | 11/2014 | Madsen et al. | |
| 8,941,336 | B1 | 1/2015 | Liu et al. | |
| 9,405,290 | B1 | 8/2016 | Malkova et al. | |
| 9,595,481 | B1 | 3/2017 | Malkova et al. | |
| 9,664,734 | B2 | 5/2017 | Malkova et al. | |
| 9,915,522 | B1 | 3/2018 | Jiang et al. | |
| 9,978,560 | B2 | 5/2018 | Bergendahl et al. | |
| 10,418,488 | B2 * | 9/2019 | Morin | H01L 27/1211 |
| 11,011,635 | B2 * | 5/2021 | Kung | H01L 21/0243 |
| 2009/0228132 | A1 | 9/2009 | Lensing et al. | |
| 2009/0279090 | A1 | 11/2009 | Wolf et al. | |
| 2013/0114085 | A1 | 5/2013 | Wang et al. | |
| 2014/0111791 | A1 | 4/2014 | Manassen et al. | |
| 2014/0172394 | A1 | 6/2014 | Kuznetsov et al. | |
| 2014/0222380 | A1 | 8/2014 | Kuznetsov et al. | |
| 2014/0297211 | A1 | 10/2014 | Pandev et al. | |
| 2014/0316730 | A1 | 10/2014 | Shchegrov et al. | |
| 2015/0042984 | A1 | 2/2015 | Pandev et al. | |
| 2015/0046118 | A1 | 2/2015 | Pandev et al. | |
| 2015/0058813 | A1 | 2/2015 | Kim et al. | |
| 2015/0110249 | A1 | 4/2015 | Bakeman et al. | |
| 2015/0199463 | A1 | 7/2015 | Iloreta et al. | |
| 2016/0109375 | A1 | 4/2016 | Pandev et al. | |
| 2016/0139032 | A1 | 5/2016 | Rampoldi et al. | |
| 2016/0141193 | A1 | 5/2016 | Pandev et al. | |
| 2016/0282105 | A1 | 9/2016 | Pandev | |
| 2017/0315456 | A1 | 11/2017 | Lin et al. | |
| 2018/0059019 | A1 | 3/2018 | Houssam et al. | |
| 2019/0017946 | A1 | 1/2019 | Wack et al. | |
| 2020/0041563 | A1 | 2/2020 | Tinnemans et al. | |
| 2020/0133140 | A1 | 4/2020 | Warnaar et al. | |

OTHER PUBLICATIONS

Affans'Ev, V.V., et al., "Internal photoemission at interfaces of high-k insulators with semiconductors and metals," J. Appl. Phys. 102, 081301 (2007).

Zhang, Q., et al., "Tunnel field-effect transistor heterojunction band alignment by internal photoemission spectroscopy," Appl. Phys. Lett. 100, 102104 (2012).

Sato, Y., et al., "Carrier Density Dependence of Optical Band Gap and Work Function in Sn-Doped In2O3 Films," Appl. Phys. Express 3 (2010).

Chouaib, Houssam, et al., "Rapid photoreflectance spectroscopy for strained silicon metrology," Review of Scientific Instruments 79.10, 103106 (2008).

Singh, Jasprit, "Physics of semiconductors and their heterostructures," McGraw-Hill, Inc., 1993, Chapters 4,5.

Chuang, Shun Lien, "Physics of optoelectronics devices," John Wiley & Sons, Inc., 1995, Chapter 7.

A.S. Ferlauto et al., Analytical model for the optical functions of amorphous semiconductors from the near-infrared to ultraviolet: Application in thin film photovoltaics, Journal of Applied Physics, vol. 92, No. 5, Sep. 1, 2002, pp. 2424-2436.

N.V. Nguyen et al., Sub-bandgap defect states in polycrystalline hafnium oxide and their suppression by admixture of silicon, Applied Physics Letters, vol. 87, 192903, (2005).

N.V. Nguyen et al., Optical Properties of Jet-Vapor-Deposited TiAlO and HfAlO Determined by Vacuum Ultraviolet Spectroscopic Ellipsometry, Proceedings of the AIP 2003 International Conference on Characterization and Metrology for ULSI Technology, 683, (2003), pp. 181-185.

J. Price et al., Identification of interfacial defects in high-k gate stack films by spectroscopic ellipsometry, Journal of Vacuum Science & Technology B, vol. 27, No. 1, (2009), pp. 310-312.

J. Price et al., Identification of sub-band-gap absorption features at the HfO2Si(100) interface via spectroscopic ellipsometry, Applied Physics Letters, vol. 91, 061925, (2007).

Douglas J. Paul, "Si/SiGe heterostructures: from material and physics to devices and circuits," Semicond. Sci. Technol. 19 (2004) R75-R108.

* cited by examiner

SCATTEROMETRY BASED METHODS AND SYSTEMS FOR MEASUREMENT OF STRAIN IN SEMICONDUCTOR STRUCTURES

CROSS REFERENCE TO RELATED APPLICATION

The present application for patent claims is a continuation of, and claims priority under 35 U.S.C. § 120 from, U.S. patent application Ser. No. 16/660,492, entitled "Scatterometry Based Methods And Systems For Measurement Of Strain In Semiconductor Structures," filed Oct. 22, 2019, which, in turn, claims priority under 35 U.S.C. § 119 from U.S. provisional patent application Ser. No. 62/782,026, entitled "Dual Angle Strain In Grating Metrology," filed Dec. 19, 2018, the subject matter of each is incorporated herein by reference in its entirety.

TECHNICAL FIELD

The described embodiments relate to metrology systems and methods, and more particularly to methods and systems for improved measurement accuracy.

BACKGROUND INFORMATION

Semiconductor devices such as logic and memory devices are typically fabricated by a sequence of processing steps applied to a specimen. The various features and multiple structural levels of the semiconductor devices are formed by these processing steps. For example, lithography among others is one semiconductor fabrication process that involves generating a pattern on a semiconductor wafer. Additional examples of semiconductor fabrication processes include, but are not limited to, chemical-mechanical polishing, etch, deposition, and ion implantation. Multiple semiconductor devices may be fabricated on a single semiconductor wafer and then separated into individual semiconductor devices.

Metrology processes are used at various steps during a semiconductor manufacturing process to detect defects on wafers to promote higher yield. Optical and x-ray based metrology techniques offer the potential for high throughput without the risk of sample destruction. A number of techniques including scatterometry and reflectometry implementations and associated analysis algorithms are commonly used to characterize critical dimensions, film thicknesses, composition and other parameters of nanoscale structures.

As devices (e.g., logic and memory devices) move toward smaller nanometer-scale dimensions, characterization becomes more difficult. Devices incorporating complex three-dimensional geometry and materials with diverse physical properties contribute to characterization difficulty.

Conductivity of a transistor channel is directly proportional to the mobility of the charge carrier. For N-type Metal Oxide Semiconductor (NMOS) devices, the charge carrier is the electron. For P-type Metal Oxide Semiconductor (PMOS) devices, the charge carrier is the hole. Mobility of electrons in a solid increase with tensile strain, while mobility of holes increase with compressive strain. Thus, uniaxial strain along a transistor channel is directly related to the electrical properties of PMOS and NMOS devices, and a measurement of the uniaxial strain is indicative of device quality.

In one example, NMOS and PMOS devices are fabricated in a strained state to increase electrical efficiency (i.e., increased computational speed with reduced electrical losses). NMOS devices are fabricated in a state of tensile strain to increase electron mobility along the channel of the device and PMOS devices are fabricated in a state of compressive strain to increase hole mobility along the channel of the device.

The compressive strain along the channel of a PMOS device is induced by a lattice mismatch between the Silicon channel material and another material that acts as a conductive contact at the ends of the channel. In many examples, the mismatched material is an epitaxial Silicon-Germanium (e.g., $Si_{i-x}Ge_x$). In these examples, the Germanium concentration controls the degree of lattice mismatch, and therefore, influences the induced strain.

The tensile strain along the channel of a NMOS device is also induced by a lattice mismatch between the Silicon channel material and another material that acts as a conductive contact at the ends of the channel. In many examples, the mismatched material is Silicon Carbide or Silicon doped with Phosphorous. In these examples, the Phosphorous concentration or structure of the Silicon Carbide controls the degree of lattice mismatch, and therefore, influences the induced strain.

FIG. 1A depicts a transistor 10 in an unstrained state. Transistor 10 includes a channel 12, source 11, drain 13, and gate 14. Source 11 and drain 13 are fabricated at either end of channel 12, and gate 14 is fabricated onto channel 12 to control the electrical conductivity along channel 12.

FIG. 1B depicts a transistor 15 having a channel 12 in a state of tensile strain. Transistor 15 includes channel 12, source 16, drain 17, and gate 14. Source 16 and drain 17 are fabricated at either end of channel 12 with materials having a lattice mismatch with the material of channel 12. The lattice mismatch induces uniaxial tensile strain along channel 12.

FIG. 1C depicts a transistor 20 having a channel 12 in a state of compressive strain. Transistor 20 includes channel 12, source 18, drain 19, and gate 14. Source 18 and drain 19 are fabricated at either end of channel 12 with materials having a lattice mismatch with the material of channel 12. The lattice mismatch induces uniaxial compressive strain along channel 12.

Unfortunately, measuring strain along a channel of a semiconductor device is difficult. The inventors are unaware of any pre-existing measurement systems available to directly measure strain in-cell or in-grating.

Typically, strain is measured indirectly at the electrical test step after the device is completely fabricated. Electrical measurements of the completed device are employed to indirectly estimate the state of uniaxial strain in the device. Measurement of strain at the end of a lengthy and expensive manufacturing process leads to increased cost and delay when optimizing a semiconductor manufacturing process. In some examples, a strained material is fabricated on a wafer very early in a manufacturing process that takes over one month to complete.

Early detection of epitaxial deposition problems is important because the epitaxy (strain engineering) occurs early in a lengthy and expensive manufacturing process. As strained semiconductor structures become more common, measurement of strain early in the semiconductor fabrication process is desired.

SUMMARY

Methods and systems for measuring optical properties of transistor channel structures and linking the optical properties to the state of strain are presented herein. Optical scatterometry measurements of strain are performed on metrology targets that closely mimic partially manufactured, real device structures.

In some examples, optical scatterometry based measurements of strain are performed on partially manufactured Fin Field Effect Transistor (FINFET) metrology targets. Measurement of strain immediately after the epitaxial growth steps that form the source and drain structures of a FINFET transistor enables rapid refinement of the epitaxial growth process and early estimation of the various electrical characteristics such as the threshold voltage of a completed semiconductor device.

In one aspect, optical scatterometry is employed to measure uniaxial strain in a semiconductor channel based on differences in measured spectra along and across the semiconductor channel. Strain along a semiconductor channel is uniaxial (i.e., aligned with the direction of extent of the channel between the source and the drain of the transistor). Because the strain is uniaxial, optical properties are different parallel to the uniaxial strain direction and orthogonal to the uniaxial strain direction. In addition, changes in the state of uniaxial strain along the channel causes changes in the values of optical constants in the direction of uniaxial strain, but not in the direction orthogonal to the direction of uniaxial strain (i.e., a direction orthogonal to the direction of extent the channel between the source and the drain of the transistor).

In general, optical scatterometry measurement data is sensitive to both the geometric features of the measured transistor structures and the optical properties of the underlying materials, including optical properties of the transistor channel affected by uniaxial strain. To estimate the state of strain of the transistor channel based on optical scatterometry measurements, the effect of strain on the measured spectra is decorrelated from other contributors, such as the geometry of the measured metrology targets and material properties of other structures captured in the measurement (e.g., source and drain structures, etc.).

In a further aspect, the geometry of the metrology target under measurement is measured by another measurement system, and the measured geometry is fed forward into the optical scatterometry measurement model.

In another further aspect, a trained geometric measurement model is employed to estimate the geometric profile of the metrology target under measurement based on the measured spectral signals. The estimated geometric profile is fed forward into the optical scatterometry measurement model.

In a further aspect, material properties of the metrology target under measurement are directly measured by another measurement system, and the measured material properties are fed forward into the optical scatterometry measurement model.

In another further aspect, a multi-model approach is employed to resolve the geometry of the metrology target under measurement and to provide a reference for the estimation of the absolute value of strain. Optical scatterometry measurements are performed on a metrology target pair including a strained metrology target and a corresponding unstrained metrology target.

In some embodiments, the strained metrology target is a metrology target fabricated with a fin structure made from a different material than the source and drain structures. In some of these embodiments, the unstrained metrology target is a partially fabricated metrology target where the fin is not etched and the source and drain structures are not fabricated. In these embodiments, the channel structure is unstrained because there is no lattice mismatch present at the ends of the channel structure. In some other embodiments, the unstrained metrology target is a partially fabricated metrology target where the fin structure material is the same material used to fabricate the source and drain structures. Because the materials are the same, there is no lattice mismatch and no induced strain in the channel.

In some embodiments, the measured spectra collected from the unstrained metrology target are processed to solve for the geometric parameters that describe the geometry of the unstrained target. Since, the geometry of the strained and unstrained targets is the same, the geometry parameters determined based on measurements of the unstrained target are fed forward to the analysis of the optical parameters of the strained target. In this manner, the contributions to measured spectra from the geometric features are decorrelated from the contributions to measured spectra due to strain.

In some other embodiments, the measured spectra from both the unstrained and strained targets are processed in a multi-target analysis. In this analysis, both the geometric parameters and the optical parameters are resolved in a combined analysis where geometric parameters for the strained and unstrained models are linked but the band gap and other related dispersion parameters that are affected by strain can vary independently.

In a further aspect, the measured spectra collected from the strained and unstrained metrology targets is processed to solve for the band gap energy of the strained channel and for the band gap energy of the unstrained channel. In some embodiments, the optical scatterometry measurements of a transistor channel of both the strained and unstrained targets are performed at the same angle of the incident electric field with respect to the transistor channel. The absolute value of strain in the strained channel is then determined based on the difference between the band gap energy of the strained channel and the band gap energy of the unstrained channel.

In another further aspect, a trained strain measurement model is employed to estimate a relative value of strain of the transistor channel of a metrology target based on the measured spectral signals.

In another further aspect, the value of strain in the channel of a semiconductor structure is correlated to electrical test results obtained from the finished device. A model of this correlation is subsequently used to predict the electrical performance of the finished device based on values of strain measured at an early stage of the manufacturing process.

The foregoing is a summary and thus contains, by necessity, simplifications, generalizations and omissions of detail; consequently, those skilled in the art will appreciate that the summary is illustrative only and is not limiting in any way. Other aspects, inventive features, and advantages of the devices and/or processes described herein will become apparent in the non-limiting detailed description set forth herein.

DETAILED DESCRIPTION

Figure 1A:
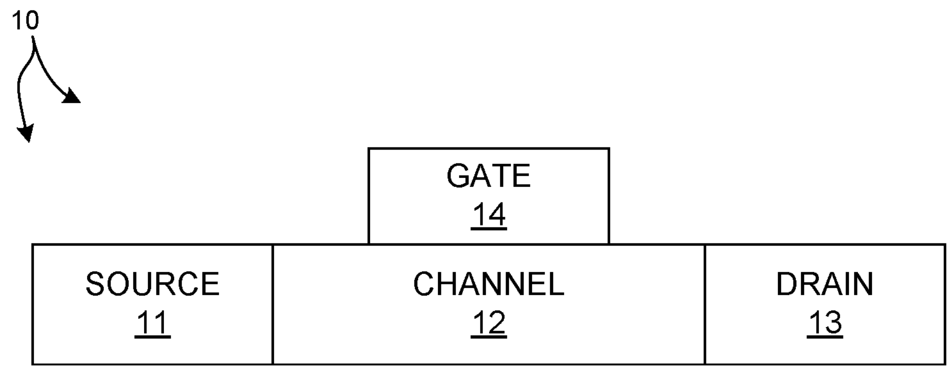
FIG. 1A depicts a transistor in an unstrained state.

Reference will now be made in detail to background examples and some embodiments of the invention, examples of which are illustrated in the accompanying drawings.

Methods and systems for measuring optical properties of transistor channel structures and linking the optical properties to the state of strain of the measured channel structures are presented herein. More specifically, optical scatterometry is employed to measure optical properties of semiconductor structures that are sensitive to the state of strain. Optical scatterometry directly probes the state of strain because changes in the strain state change the band structure of the measured material, which, in turn, changes the values of measured optical properties.

Optical scatterometry measurements of strain are performed on metrology targets that closely mimic partially manufactured, real device structures (i.e., device structures further manufactured into functioning electronic devices). The metrology targets are two dimensional or three dimensional device-like grating (i.e., periodic) targets. The size of the metrology targets and the real device structures imitated by the metrology targets are the same. For example, the critical dimensions of the major structures of the real device and the metrology target are the same (e.g., source, drain, channel dimensions). Direct, physics based, nondestructive measurements of real device structures are often not possible because the real device structures are typically not periodic. In some embodiments, corresponding metrology targets are missing some nonessential features that cause aperiodicity of the corresponding real device. Without these nonessential features, the metrology targets are periodic and are suitable for optical scatterometry based measurement.

In some examples, optical scatterometry based measurements of strain are performed on partially manufactured Fin Field Effect Transistor (FINFET) metrology targets. The ability to measure strain immediately after the epitaxial growth steps that form the source and drain structures of a FINFET transistor enables rapid refinement of the epitaxial growth process and early estimation of the various electrical characteristics such as the threshold voltage of a completed semiconductor device. This is useful during fabrication recipe optimization at process development fabrication facilities. In addition, the ability to measure strain immediately after the epitaxial growth steps that form the source and drain structures of the FINFET transistor enables immediate monitoring of the epitaxial growth process to quickly identify unacceptable excursions during high volume manufacturing of FINFET devices.

A change in the state of strain of a solid material causes a change in the optical band structure of the strained material. Thus, the values of optical constants of an optical dispersion model employed to characterize a material change as a result of changes in the strain state of the measured material. Exemplary optical constants that are sensitive to strain include the real (n) and imaginary (k) components of the complex index of refraction, the real ($\varepsilon_1$) and the imaginary ($\varepsilon_2$) parts of the dielectric function, reflectance, and derived properties, such as band gap and other band structure parameters.

A state of uniaxial tensile strain in a Silicon structure modifies the electronic band structure, which in turn, changes the resistivity of the Silicon structure. Microscopically, the number of symmetry operations allowed is reduced, and the number of symmetry operations allowed depends on the way the Silicon crystal is stressed. Breaking the lattice symmetry of the Silicon crystal causes a shift in the energy levels of the different conduction and valence bands, distortion of the different conduction and valence bands, removal of degeneracy, or any combination thereof.

In one example, an in-plane biaxial tensile strain is applied to a Silicon crystal and a uniaxial compressive strain is induced in the direction perpendicular to the plane. The degeneracy is removed in the four Δ4 valleys and the two out of plane Δ2 valleys of the conduction band minimum. The energy is therefore split. Various theoretical simulations studying the effect of biaxial strain on the conduction band and valence band are described in the article entitled "Si/SiGe heterostructures: from material and physics to devices and circuits," Semicond. Sci. Technol. 19 (2004) R75-R108, by Douglas J. Paul, the content of which is incorporated herein by reference in its entirety. The article describes changes in the effective mass as a function of strain applied and the change in the mobility and the critical points (energy levels) as a function of strain applied.

A model linking bandgap energy to an absolute value of strain is described in "Rapid photoreflectance spectroscopy for strained silicon metrology," by Chouaib et al., Review of Scientific Instruments 79.10, 103106 (2008), the subject matter of which is incorporated herein by reference in its entirety. The model relates strain to a change in band energy of Silicon as illustrated in equation (1), $$\Delta E = \sqrt{\frac{1}{3}}\,D_1^1(\varepsilon_{per} + 2\varepsilon_{par}) + \sqrt{\frac{2}{3}}\,D_3^3(\varepsilon_{per} - \varepsilon_{par}) \tag{1}$$

where $\Delta E$ is similar to the change in band gap energy, $\varepsilon_{per}$, is the strain along a direction perpendicular to the incident light, $\varepsilon_{par}$, is the strain in the direction parallel to the incident light, $D_1^1$, is the hydrostatic deformation potential of Si measured to be −9.8 eV, and $D_3^3$ is the intraband strain deformation having a value of 4.7 eV. Equation (1) can be simplified to equation (2).

$$\Delta E=-5.658(\varepsilon_{per}+2\varepsilon_{par})+3.837(\varepsilon_{per}-\varepsilon_{par}) \tag{2}$$

Uniaxial strain along a FINFET channel (i.e., along the direction connecting the source and drain) reduces crystal symmetry and increases symmetry-determined band degeneracies. The strain tensor for uniaxial strain along the channel (i.e., direction [1 0 0]) can be expressed as $$\varepsilon = \begin{matrix} \varepsilon_{par} & 0 & 0 \\ 0 & 0 & 0 \\ 0 & 0 & \varepsilon_{per} \end{matrix} \tag{3}$$

where $\varepsilon_{par}$ is the strain along the channel (i.e., direction [1 0 0]) and $\varepsilon_{per}$ is the strain normal to the surface of the channel (i.e., direction [0 0 1]). Uniaxial strain along direction [1 0 0] splits the conduction band minimum (CBM) differently compared with uniaxial strain along direction [0 1 0] or direction [0 0 1]. Instead of two sets of sub-bands, uniaxial strain along direction [1 0 0] with direction [0 1 0] confined will create three sets of sub-bands with each set doubly degenerate, marked as I, II & III. The energy splitting between each pair is determined as illustrated in equations (4) and (5), $$\Delta E_{\Delta I}-\Delta E_{\Delta III}=\Delta E_{\Delta}^{100,\bar{1}00}-\Delta E_{\Delta}^{001,00\bar{1}}=\left(1+\frac{c_{12}}{c_{11}}\right)\Xi_u^{\Delta}\varepsilon \tag{4}$$

$$\Delta E_{\Delta II}-\Delta E_{\Delta III}=\Delta E_{\Delta}^{010,0\bar{1}0}-\Delta E_{\Delta}^{001,00\bar{1}}=\left(\frac{c_{12}}{c_{11}}\right)\Xi_u^{\Delta}\varepsilon \tag{5}$$

where $\varepsilon$ is the uniaxial strain, $\Xi_u^{\Delta}$ is the uniaxial deformation potential, and $c_{11}$ and $c_{12}$ are the compliance coefficients of Silicon. As a result, Silicon material under uniaxial strain exhibits anisotropic optical properties. Thus, the optical dispersion of the material under measurement depends on the orientation of the incident electric field with respect to the structure itself. Furthermore, the estimated values of optical properties derived from measured spectra also depend on the orientation of the incident electric field with respect to the structure itself.

In one aspect, optical scatterometry is employed to measure uniaxial strain in a semiconductor channel based on differences in measured spectra along and across the semiconductor channel.

Strain along a semiconductor channel is uniaxial (i.e., aligned with the direction of extent of the channel between the source and the drain of the transistor). Because the strain is uniaxial, optical properties are different parallel to the uniaxial strain direction and orthogonal to the uniaxial strain direction. In addition, changes in the state of uniaxial strain along the channel causes changes in the values of optical constants in the direction of uniaxial strain, but not in the direction orthogonal to the direction of uniaxial strain (i.e., a direction orthogonal to the direction of extent the channel between the source and the drain of the transistor).

In some examples, optical scatterometry measurements of a transistor channel of a FINFET device are performed at two different angles of the incident electric field with respect to the transistor channel. Measured differences in the Silicon band gap of the channel are employed to determine the direction and magnitude of the uniaxial strain present along the channel structure. In some of these examples, the band gap of the uniaxially strained FINFET channel is measured parallel and orthogonal to the direction of uniaxial strain by optical scatterometry. The difference in measured band gap is indicative of the state of strain present along the channel structure. In these examples, the band gap of the uniaxially strained FINFET channel as measured parallel to the direction of extent of the channel is $E_{g0}$, and the band gap of the uniaxially strained FINFET channel as measured perpendicular to the direction of extent of the channel is $E_{g90}$. Assuming the difference in these band gaps accurately represents the difference in band energy between the strained and unstrained states, and assuming the strain in the direction perpendicular to the direction of extent of the channel is negligible, equation (2) can be rewritten as illustrated in equation (6).

$$\Delta E=E_{g0}-E_{g90}=-15.153(\varepsilon_{par}) \tag{6}$$

In this manner, the absolute value of strain along the direction of extent of the channel from source to drain is estimated based on the difference between the band gaps as measured parallel and perpendicular to the direction of extent of the channel.

Figure 2:
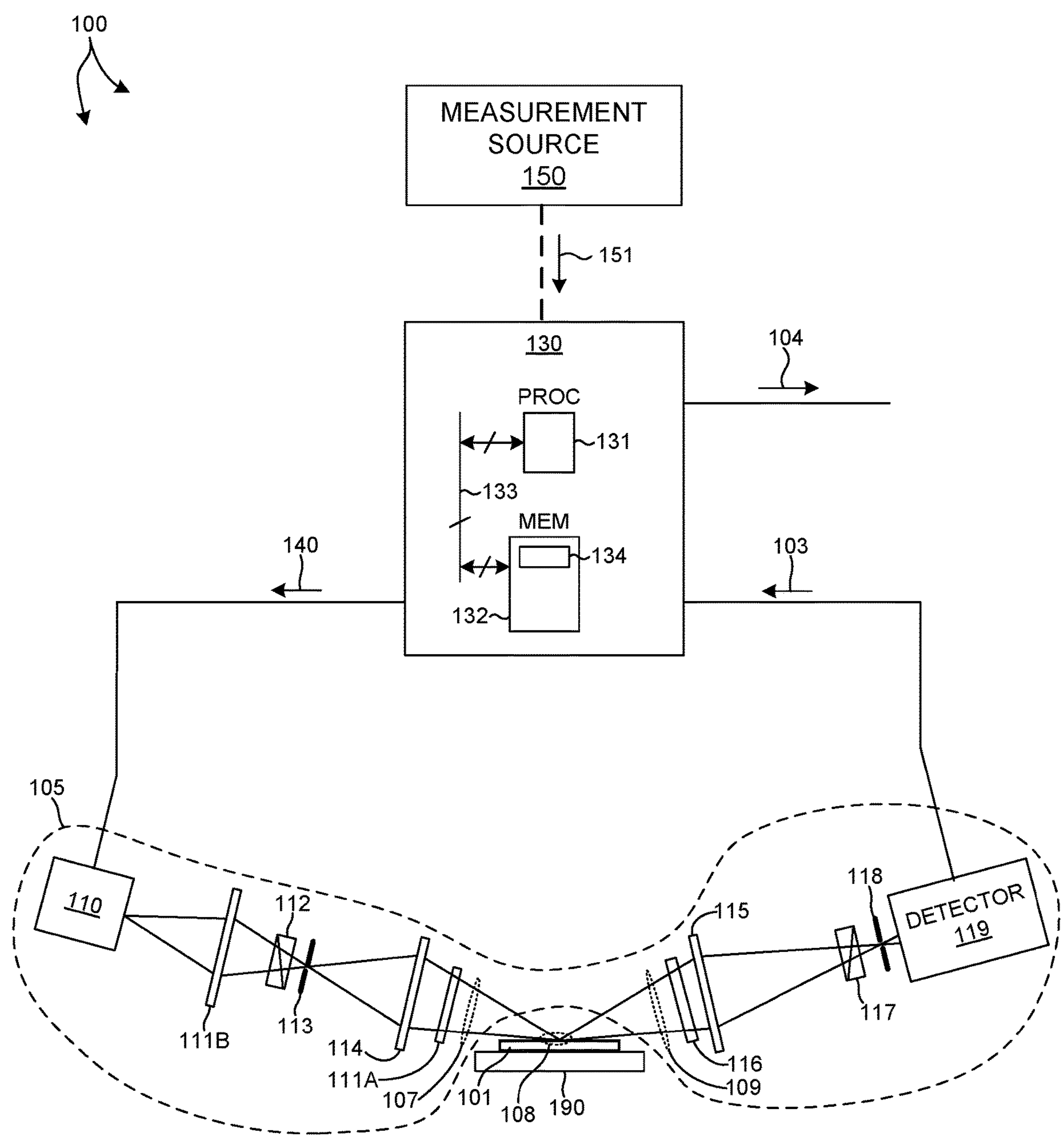
FIG. 2 is a diagram illustrative of an embodiment of a spectroscopic ellipsometer (SE) metrology system 100 for performing SE measurements of one or more metrology targets as described herein.

FIG. 2 depicts an exemplary spectroscopic ellipsometer (SE) metrology system 100 for performing SE measurements of one or more metrology targets as described herein. As depicted in FIG. 2, metrology system 100 includes a SE subsystem.

SE subsystem 105 includes an illumination source 110 that generates a beam of illumination light 107 incident on wafer 101. In some embodiments, illumination source 110 is a broadband illumination source that emits illumination light in the ultraviolet, visible, and infrared spectra. In one embodiment, illumination source 110 is a laser sustained plasma (LSP) light source (a.k.a., laser driven plasma source). The pump laser of the LSP light source may be continuous wave or pulsed. A laser-driven plasma source can produce significantly more photons than a Xenon lamp across the entire wavelength range from 150 nanometers to 2,500 nanometers. Illumination source 110 can be a single light source or a combination of a plurality of broadband or discrete wavelength light sources. The light generated by illumination source 110 includes a continuous spectrum or parts of a continuous spectrum, from ultraviolet to infrared (e.g., vacuum ultraviolet to mid infrared). In general, illumination light source 110 may include a super continuum laser source, an infrared helium-neon laser source, an arc lamp, a globar source, or any other suitable light source.

In some embodiments, the amount of illumination light is broadband illumination light that includes a range of wavelengths spanning at least 500 nanometers. In one example, the broadband illumination light includes wavelengths below 250 nanometers and wavelengths above 750 nanometers. In general, the broadband illumination light includes wavelengths between 120 nanometers and 4,200 nanometers. In some embodiments, broadband illumination light including wavelengths beyond 4,200 nanometers may be employed. In some embodiments, illumination source 110 includes a deuterium source emitting light with wavelengths across a range from 150 nanometers to 400 nanometers, a LSP source emitting light with wavelengths across a range from 180 nanometers to 2,500 nanometers, a supercontinuum source emitting light with wavelengths across a range from 800 nanometers to 4,200 nanometers, and a globar source emitting light with wavelengths across a range from 2,000 nanometers to 20,000 nanometers.

As depicted in FIG. 2, SE subsystem 105 includes an illumination subsystem configured to direct illumination light 107 to one or more structures formed on the wafer 101. The illumination subsystem is shown to include light source 110, illumination optics 111A, one or more optical filters 111B, polarizing component 112, illumination field stop 113, and illumination pupil aperture stop 114. As depicted, in FIG. 2, the beam of illumination light 107 passes through illumination optics 111A, optical filter(s) 111B, polarizing component 112, field stop 113, and aperture stop 114 as the beam propagates from the illumination source 110 to wafer 101. Beam 107 illuminates a portion of wafer 101 over a measurement spot 108.

The illumination optics 111A conditions illumination light 107 and focuses illumination light 107 on measurement spot 108. The one or more optical filters 111B are used to control light level, spectral output, or combinations thereof, from the illumination subsystem. In some examples, one or more multi-zone filters are employed as optical filters 111B. Polarizing component 112 generates the desired polarization state exiting the illumination subsystem. In some embodiments, the polarizing component is a polarizer, a compensator, or both, and may include any suitable commercially available polarizing component. The polarizing component can be fixed, rotatable to different fixed positions, or continuously rotating. Although the SE illumination subsystem depicted in FIG. 2 includes one polarizing component, the SE illumination subsystem may include more than one polarizing component. Field stop 113 controls the field of view (FOV) of the illumination subsystem and may include any suitable commercially available field stop. Aperture stop 114 controls the numerical aperture (NA) of the illumination subsystem and may include any suitable commercially available aperture stop. Light from illumination source 110 is focused on one or more structures (not shown in FIG. 1) on wafer 101. The SE illumination subsystem may include any type and arrangement of illumination optics 111A, optical filter(s) 111B, polarizing component 112, field stop 113, and aperture stop 114 known in the art of spectroscopic ellipsometry.

Metrology system 100 also includes a collection optics subsystem configured to collect light generated by the interaction between the one or more structures and the incident illumination beam 107. A beam of collected light 109 is collected from measurement spot 108 by collection optics 115. Collected light 109 passes through collection aperture stop 116, polarizing element 117, and field stop 118 of the collection optics subsystem.

Collection optics 115 includes any suitable optical elements to collect light from the one or more structures formed on wafer 101. Collection aperture stop 116 controls the NA of the collection optics subsystem. Polarizing element 117 analyzes the desired polarization state. The polarizing element 117 is a polarizer or a compensator. The polarizing element 117 can be fixed, rotatable to different fixed positions, or continuously rotating. Although the collection subsystem depicted in FIG. 2 includes one polarizing element, the collection subsystem may include more than one polarizing element. Collection field stop 118 controls the FOV of the collection subsystem. The collection subsystem takes light from wafer 101 and directs the light through collection optics 115, aperture stop 116, and polarizing element 117 to be focused on collection field stop 118. In some embodiments, collection field stop 118 is used as a spectrometer slit for the spectrometers of the detection subsystem. However, collection field stop 118 may be located at or near a spectrometer slit of the spectrometers of the detection subsystem.

The collection subsystem may include any type and arrangement of collection optics 115, aperture stop 116, polarizing element 117, and field stop 118 known in the art of spectroscopic ellipsometry.

Figure 1B:
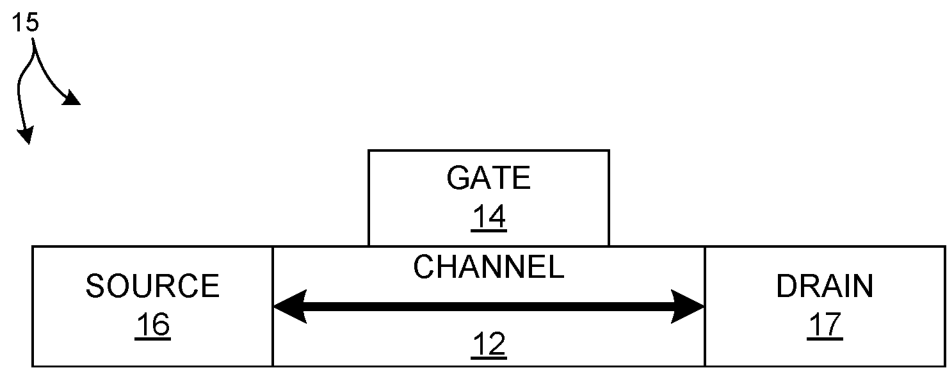
FIG. 1B depicts a transistor having a channel in a state of tensile strain.
Figure 1C:
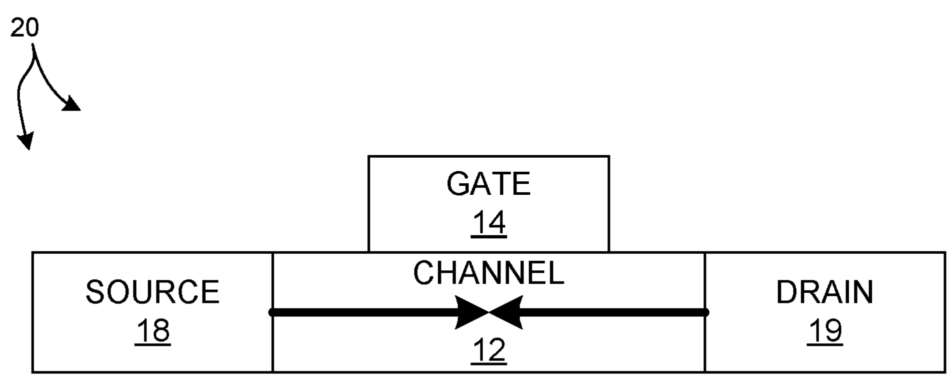
FIG. 1C depicts a transistor having a channel in a state of compressive strain.

In the embodiment depicted in FIG. 1, the collection optics subsystem directs light to detector 119. Detector 119 generates output responsive to light collected from the one or more structures illuminated by the illumination subsystem at measurement spot 108. In one example, detector 119 includes charge coupled devices (CCD) sensitive to ultraviolet and visible light (e.g., light having wavelengths between 190 nanometers and 860 nanometers). In other examples, detector 119 includes a photo detector array (PDA) sensitive to infrared light (e.g., light having wavelengths between 950 nanometers and 2500 nanometers). However, in general, detector 119 may include other detector technologies and arrangements (e.g., a position sensitive detector (PSD), an infrared detector, a photovoltaic detector, a quadrature cell detector, a camera, etc.). Each detector converts the incident light into electrical signals indicative of the spectral intensity of the incident light. In general, detector 119 generates output signals 103 indicative of the light detected on detector 119.

Figure 12:
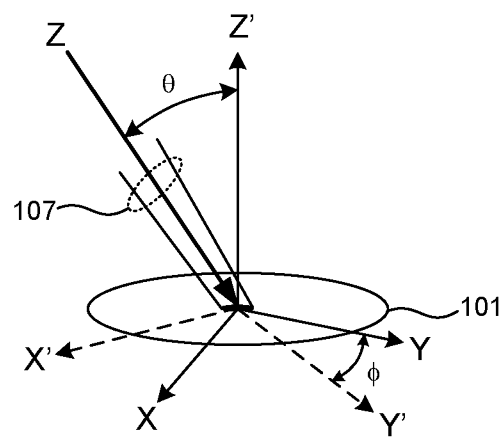
FIG. 12 is a diagram illustrative of an illumination beam incident on a wafer at a particular orientation described by an angle of incidence, θ, and an azimuth angle, ϕ.

Each orientation of the illuminating beam 107 relative to the surface normal of semiconductor wafer 101 is described by any two angular rotations of wafer 101 with respect to the illumination beam 107, or vice-versa. In one example, the orientation can be described with respect to a coordinate system fixed to the wafer. FIG. 12 depicts illumination beam 107 incident on wafer 101 at a particular orientation described by an angle of incidence, θ, and an azimuth angle, ϕ. Coordinate frame XYZ is fixed to the SE metrology system (e.g., illumination beam 107) and coordinate frame X'Y'Z' is fixed to wafer 101. The Y axis is aligned in plane with the surface of wafer 101. X and Z are not aligned with the surface of wafer 101. Z' is aligned with an axis normal to the surface of wafer 101, and X' and Y' are in a plane aligned with the surface of wafer 101. As depicted in FIG. 12, illumination beam 107 is aligned with the Z-axis and thus lies within the XZ plane. Angle of incidence, θ, describes the orientation of the illumination beam 107 with respect to the surface normal of the wafer in the XZ plane. Furthermore, azimuth angle, ϕ, describes the orientation of the XZ plane with respect to the X'Z' plane. Together, θ and ϕ, uniquely define the orientation of the illumination beam 107 with respect to the surface of wafer 101. In this example, the orientation of the illumination beam with respect to the surface of wafer 101 is described by a rotation about an axis normal to the surface of wafer 101 (i.e., Z' axis) and a rotation about an axis aligned with the surface of wafer 101 (i.e., Y axis).

As illustrated in FIG. 2, SE metrology tool 100 includes a specimen positioning system 190 configured to both align specimen 101 and orient specimen 101 over a large range of angles of incidence and azimuth angle with respect to the illumination beam 107. In this manner, measurements of specimen 101 are collected by metrology system 100 over any number of locations and orientations on the surface of specimen 101. In one example, computing system 130 communicates command signals (not shown) to specimen positioning system 190 that indicate the desired position of specimen 101. In response, specimen positioning system 190 generates command signals to the various actuators of specimen positioning system 190 to achieve the desired positioning of specimen 101.

In general, specimen positioning system 190 may include any suitable combination of mechanical elements to achieve the desired linear and angular positioning performance, including, but not limited to goniometer stages, hexapod stages, angular stages, and linear stages.

Figure 11:
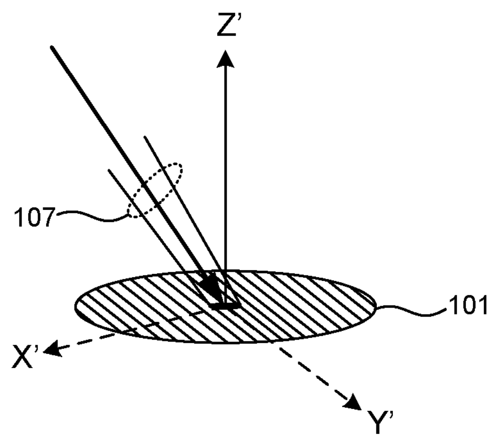
FIG. 11 is a diagram illustrative of an illumination beam incident on a wafer including periodic metrology targets disposed in the X' direction on the wafer.

In some examples, SE metrology system 100 illuminates a metrology target including an array of partially fabricated FINFET devices at two different azimuth angles, and spectral signals 103 are generated for each measurement. In some of these examples, one azimuth angle is aligned with a direction parallel to the direction of extent of the transistor channels (i.e., direction connecting source and drain), and the other azimuth angle is aligned orthogonal to the direction of extent of the transistor channels. In this manner, measurements are performed with the incident electric field of the illumination light at two orthogonal angles with respect to the transistor channel. FIG. 11 is a diagram illustrative of illumination beam 107 incident on wafer 101. As depicted in FIG. 11, the metrology targets disposed on wafer 101 are periodic in the X' direction.

Metrology system 100 also includes computing system 130 configured to receive detected signals 103 and determine an estimate of a value indicative of strain of the measured structure(s) based at least in part on the measured signals. In some examples, computing system 130 determines a band gap of the measured channels at each azimuth angle based on the measured spectra 103. Furthermore, computing system 130 determines an indication of strain present along the measured channels based on the difference between the measured Silicon band gap at each azimuth angle.

In general, an optical scatterometer, such as SE metrology system 100 is configured to deliver illumination light to a metrology target under measurement at any desired angle of incidence and azimuth angle.

Figure 3:
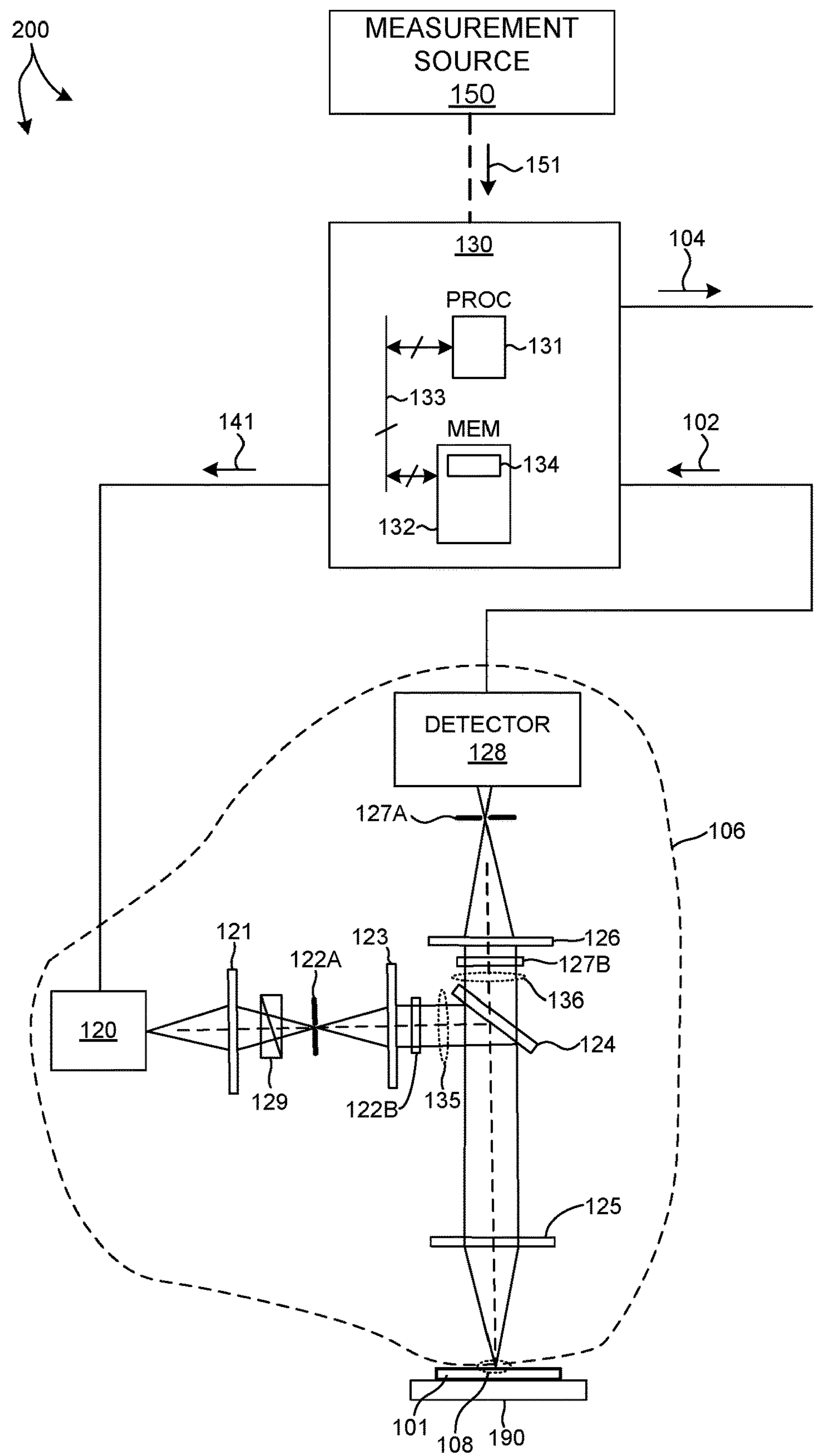
FIG. 3 is a diagram illustrative of an embodiment of a spectroscopic reflectometer (SR) metrology system 200 for performing SR measurements of one or more metrology targets as described herein.

FIG. 3 depicts an exemplary spectroscopic reflectometer (SR) metrology system 200 for performing SR measurements of one or more metrology targets as described herein. As depicted in FIG. 3, metrology system 200 includes a SR subsystem 106. SR subsystem 106 includes an illumination source 120 that generates a beam of illumination light 135 incident on wafer 101. In some embodiments, illumination source 120 is a broadband illumination source that emits illumination light in the ultraviolet, visible, and infrared spectra. In one embodiment, illumination source 120 is a laser sustained plasma (LSP) light source (a.k.a., laser driven plasma source). The pump laser of the LSP light source may be continuous wave or pulsed. A laser-driven plasma source can produce significantly more photons than a Xenon lamp across the entire wavelength range from 150 nanometers to 2,500 nanometers. Illumination source 120 can be a single light source or a combination of a plurality of broadband or discrete wavelength light sources. The light generated by illumination source 120 includes a continuous spectrum or parts of a continuous spectrum, from ultraviolet to infrared (e.g., vacuum ultraviolet to mid infrared). In general, illumination light source 120 may include a super continuum laser source, an infrared helium-neon laser source, an arc lamp, a globar source, or any other suitable light source.

In a further aspect, the amount of illumination light is broadband illumination light that includes a range of wavelengths spanning at least 500 nanometers. In one example, the broadband illumination light includes wavelengths below 250 nanometers and wavelengths above 750 nanometers. In general, the broadband illumination light includes wavelengths between 120 nanometers and 4,200 nanometers. In some embodiments, broadband illumination light including wavelengths beyond 4,200 nanometers may be employed. In some embodiments, illumination source 110 includes a deuterium source emitting light with wavelengths across a range from 150 nanometers to 400 nanometers, a LSP source emitting light with wavelengths across a range from 180 nanometers to 2,500 nanometers, a supercontinuum source emitting light with wavelengths across a range from 800 nanometers to 4,200 nanometers, and a globar source emitting light with wavelengths across a range from 2,000 nanometer to 20,000 nanometers.

As depicted in FIG. 3, SR subsystem 106 includes an illumination subsystem configured to direct illumination light 135 to the metrology targets formed on the wafer 101. The illumination subsystem is shown to include light source 120, one or more optical filters 121, illumination field stop 122A, illumination aperture stop 122B, polarizing component 129, optics 123, beam splitter 124, and objective 125. As depicted, in FIG. 3, the beam of illumination light 135 passes through optical filter(s) 121, polarizing component 129, field stop 122A, illumination aperture stop 122B, optics 123, beam splitter 124, and objective 125 as the beam propagates from the illumination source 120 to wafer 101. Beam 135 illuminates a portion of wafer 101 over a measurement spot 108.

The one or more optical filters 121 control light level, spatial output, spectral output, or combinations thereof. In some examples, one or more multi-zone filters are employed as optical filters 121. Polarizing component 129 generates the desired polarization state exiting the illumination subsystem. In some embodiments, the polarizing component is a polarizer, a compensator, or both, and may include any suitable commercially available polarizing component. The polarizing component can be fixed, rotatable to different fixed positions, or continuously rotating. Although the SR illumination subsystem depicted in FIG. 3 includes one polarizing component, the SR illumination subsystem may include more than one polarizing component. Field stop 122A controls the field of view (FOV) of the SR illumination subsystem and may include any suitable commercially available field stop. Illumination aperture stop 122B controls the illumination numerical aperture (NA) of the SR illumination subsystem and may include any commercially available aperture stop. Optics 123 direct illumination light toward beam splitter 124. Beam splitter 124 directs a portion of illumination light toward objective 125. Objective 125 focuses illumination light from beam splitter 124 over a measurement spot 108, on one or more structures (not shown in FIG. 3) on wafer 101. The SR illumination subsystem may include any type and arrangement of optical filter(s) 121, polarizing component 129, illumination field stop 122A, illumination aperture stop 122B, optics 123, beam splitter 124, and objective 125 known in the art of spectroscopic reflectometry.

SR subsystem 106 also includes a collection optics subsystem configured to collect light generated by the interaction between the one or more structures and the incident illumination beam 135. A beam of collected light 136 is collected from measurement spot 108 by objective 125. Collected light 136 passes through beam splitter 124, focusing optics 126, collection aperture stop 127B, and collection field stop 127A of the collection optics subsystem.

Objective 125 includes any suitable optical elements to collect light from the one or more structures formed on wafer 101. In some embodiments, objective 125 includes an aperture stop that controls the NA of the illumination and collection optics subsystem. Collection aperture stop 127B controls collection NA of the collection subsystem. Collection field stop 127A controls the field of view (FOV) of the collection subsystem. The collection subsystem takes light from wafer 101 and directs the light through objective 125, beam splitter 124, focusing optics 126, collection aperture stop 127B, and collection field stop 127A. In some embodiments, collection field stop 127A is used as a spectrometer slit for the spectrometers of the detection subsystem. However, collection field stop 127A may be located at or near a spectrometer slit of the spectrometers of the detection subsystem.

In some embodiments, beam splitter 124, objective 125, or both, may be common to the illumination and collection subsystems. In some embodiments, the illumination and collection subsystems have the same NA. In some embodiments, the illumination subsystem and the collection subsystem have different NA. The collection subsystem may include any type and arrangement of objective 125, beam splitter 124, focusing optics 126, collection aperture stop 127B, and field stop 127A known in the art of spectroscopic reflectometry.

In the embodiment depicted in FIG. 3, the SR collection optics subsystem directs collected light to detector 128. Detector 128 generates output responsive to light collected from the one or more structures illuminated by the illumination subsystem at measurement spot 108. In one example, detector 128 includes charge coupled devices (CCD) sensitive to ultraviolet and visible light (e.g., light having wavelengths between 190 nanometers and 860 nanometers). In other examples, detector 128 includes a photo detector array (PDA) sensitive to infrared light (e.g., light having wavelengths between 950 nanometers and 2500 nanometers). However, in general, detector 128 may include other detector technologies and arrangements (e.g., a position sensitive detector (PSD), an infrared detector, a photovoltaic detector, a quadrature cell detector, a camera, etc.). Each detector converts the incident light into electrical signals indicative of the spectral intensity of the incident light. In general, detector 128 generates output signals 102 indicative of the light detected on detector 128.

Although, FIG. 3 illustrates a polarizing component in the illumination path, in general, SR subsystem 106 may include one or more polarizing components in the illumination path, collection path, or both, to enhance the spectroscopic reflectometry measurements performed by SR subsystem 106.

In some embodiments, an optical scatterometry measurement system such as SE metrology system 100 and SR metrology system 200 extends the wavelength range of illumination light employed to measure band structure properties of high-k and low-k materials by enveloping the optical path in a chamber that is maintained in a vacuum or purged with an inert gas.

In some examples, SR metrology system 200 illuminates a metrology target including an array of partially fabricated FINFET devices at two different polarization angles, and spectral signals 102 are generated for each measurement. In some of these examples, one polarization angle results in an alignment of the incident electric field with a direction parallel to the direction of extent of the transistor channels (i.e., direction connecting source and drain), and the other polarization angle is aligned such that the incident electric field is orthogonal to the direction of extent of the transistor channels. In this manner, measurements are performed with the incident electric field of the illumination light at two orthogonal angles with respect to the transistor channel.

Metrology system 200 also includes computing system 130 configured to receive detected signals 102 and determine an estimate of a value indicative of strain of the measured structure(s) based at least in part on the measured signals. In some examples, computing system 130 determines a band gap of the measured channels at each polarization angle based on the measured spectra 102. Furthermore, computing system 130 determines an indication of strain present along the measured channels based on the difference between the measured Silicon band gap at each polarization angle.

In a further embodiment, metrology systems 100 and 200 include one or more computing systems 130 configured to execute model building and analysis tool 170 in accordance with the description provided herein. In the preferred embodiment, model building and analysis tool 170 is a set of program instructions 134 stored in a memory 132. The program instructions 134 are read and executed by one or more processors 131 to realize model building and analysis functionality as described herein. The one or more computing systems 130 may be communicatively coupled to the spectrometers 105 and 106. In one aspect, the one or more computing systems 130 are configured to receive measurement data (e.g., spectra 102, spectra 103, or both) associated with a measurement of one or more metrology targets disposed on wafer 101. In one example, the measurement data includes an indication of the measured spectral response (e.g., measured intensity as a function of wavelength) of the specimen based on the one or more sampling processes from the spectrometer. In some embodiments, the one or more computing systems 130 are further configured to estimate a value of strain in the measured transistor channels from the received measurement data.

In some examples, metrology based on optical scatterometry involves determining values of one or more optical properties, geometric parameters, or both, by the inverse solution of a pre-determined measurement model with the measured data. The measurement model includes a few (on the order of ten) adjustable parameters and is representative of the geometry and optical properties of the specimen and the optical properties of the measurement system. The method of inverse solve includes, but is not limited to, model based regression, tomography, machine learning, or any combination thereof. In this manner, target parameters are estimated by solving for values of a parameterized measurement model that minimize errors between the measured optical intensities and modeled results.

In general, an optical scatterometer as described herein may be configured to measure any suitable optical properties that may be indicative of strain. By way of non-limiting example, such optical properties include optical constants such as index of refraction, extinction coefficient, reflectance, all dielectric functions, and derived properties such as band gap and other band structure values.

In a further aspect, computing system 130 is configured to generate a structural model (e.g., geometric model, material model, or combined geometric and material model) of a measured structure of a specimen, generate an optical response model associated with the modelled structure, and resolve at least one specimen parameter value by performing a fitting analysis of optical measurement data with the optical response model. The analysis engine is used to compare the simulated optical response signals with measured data thereby allowing the determination of geometric parameters, optical parameters, or both. In the embodiment depicted in FIG. 4, computing system 130 is configured as a model building and analysis engine 170 configured to implement model building and analysis functionality as described herein.

Figure 4:
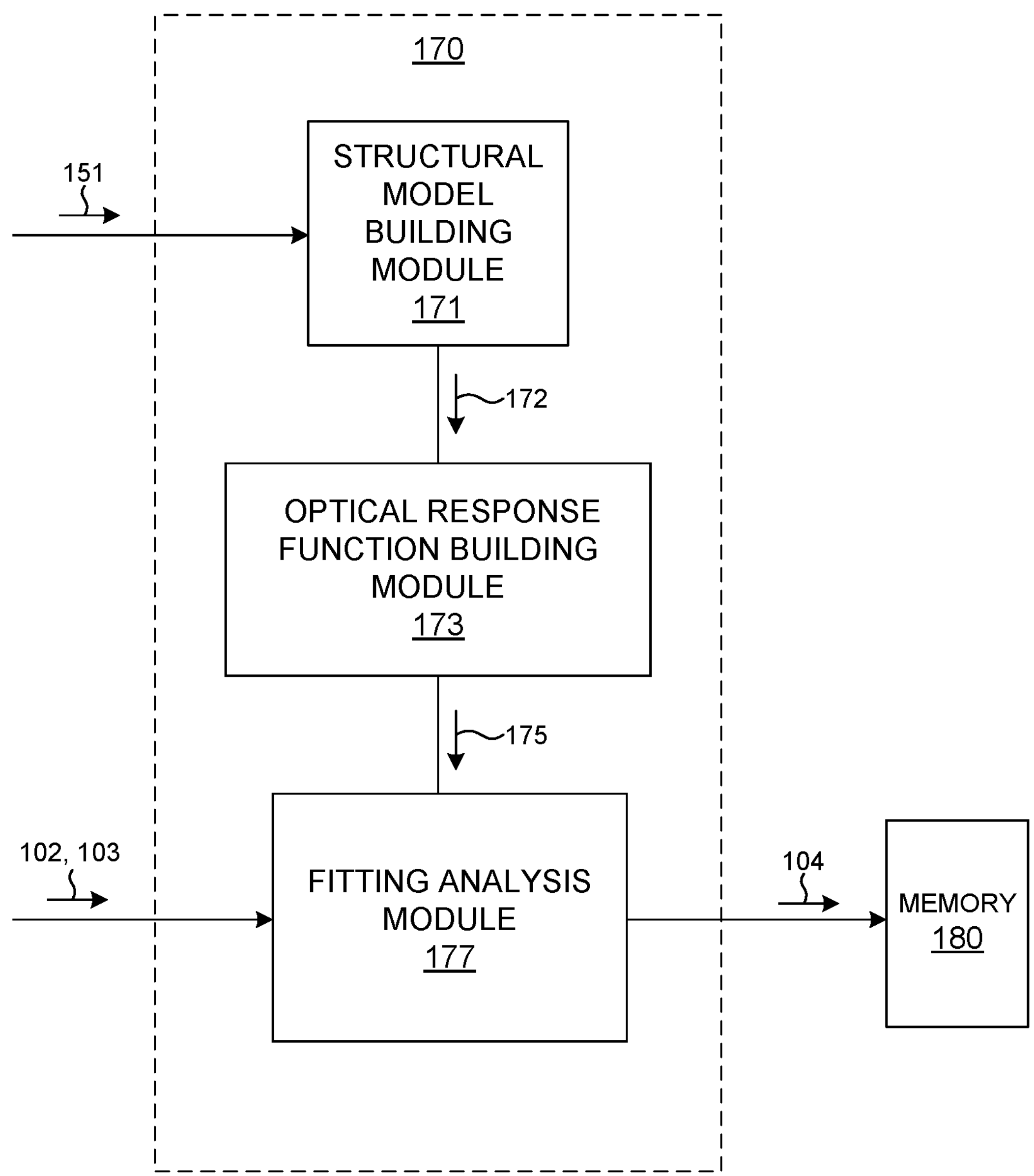
FIG. 4 is a diagram illustrative of an embodiment of a model building and analysis engine 170 configured to implement model building and analysis functionality as described herein.

As depicted in FIG. 4, model building and analysis engine 170 includes a structural model building module 171 that generates a structural model 172 of a measured metrology target disposed on wafer 101. In some embodiments, structural model 172 also includes material properties of the specimen. The structural model 172 is received as input to optical response function building module 173. Optical response function building module 173 generates an optical response function model 175 based at least in part on the structural model 172.

The optical response function model 175 includes a parametric representation of a measured optical dispersion. In some examples, the parameterized model is representative of a dielectric function that has a direct relation to the band gap parameter; a key indicator of the electrical performance of the channel structure. In general, the particular parameterization is selected to reduce the number of unknown parameters and decrease correlations among parameters.

In some examples, the optical response of one or more high-K dielectric layers is predicted based on a direct inversion method. These methods are described by way of example in J. Price et al., "Identification of interfacial defects in high-k gate stack films by spectroscopic ellipsometry," J. Vac. Sci. Technol. B 27 (1), 310 (2009) and J. Price et al., "Identification of sub-band-gap absorption features at the HfO2/Si(100) interface via spectroscopic ellipsometry," APL 91, 061925 (2007), the subject matter of each is incorporated herein in its entirety. However, direct inversion methods are computationally burdensome, very sensitive to statistical measurement errors, and do not provide a physically based model of the measured structure (i.e., the optical functions do not satisfy the Kramers-Kronig consistency condition). As a result, the utility of direct inversion methods for high-throughput inspection and process control is limited.

In some other examples, the optical response of one or more high-K dielectric layers is predicted based on a Bruggeman Effective Medium Approximation (BEMA) model. The BEMA model represents the dielectric function of the layer as an effective composition of assumed dielectric functions of constituents. The optimized effective composition is then related to the composition of the dielectric layer of interest. In general, the BEMA model is based on Kramers-Kronig consistent dielectric functions of constituents, and thus is itself Kramers-Kronig consistent. As a result, the BEMA model yields physically reasonable results. However, the value of the band gap as derived from the BEMA model is an indirect measurement that requires a reference to provide meaningfully accurate results.

Both the BEMA and the direct inversion method are used to extract dispersion curves (e.g., the real ($\varepsilon_1$) and the imaginary ($\varepsilon_2$) parts of the dielectric function, or refractive index (n) and extinction coefficient (k)) from optical scatterometry measurements. Subsequently, the calculated dispersion curves must be interpolated in the energy range of interest to evaluate the band gap. The accuracy of the band gap estimate depends strongly on the choice of the energy of interest for band gap interpolation. Moreover, since band gap must be indirectly derived from the calculated dispersion curves, a reference is required to provide accurate results. For these practical reasons, both BEMA and direct inversion are limited in their ability to accurately monitor band gap.

In some other examples, a Tauc-Lorentz model or a Cody-Lorentz model is employed as described by way of example in A. S. Ferlauto et al., "Analytical model for the optical functions of amorphous semiconductors from the near-infrared to ultraviolet: Application in thin film photovoltaics," J. Appl. Phys. 92, 2424 (2002), the subject matter of which is incorporated herein in its entirety. In these models, the imaginary part of the dielectric function is represented by a parameterized dispersion function, and the real part of the dielectric function is determined based on enforcement of Kramers-Kronig consistency. Model parameters (e.g., optical function parameters and thicknesses) are evaluated by fitting modeled spectra to measured spectra by numerical regression. The validity and limitations of the models are assessed by statistical evaluation of fitting quality and confidence limits of model parameters.

An important limitation of the conventional Cody-Lorentz function is that it has discontinuous derivatives over the energy range, E, and the resonant energy range, $E_0$, at the Urbach transition energy level, $E_T$. This leaves the dispersion model mathematically ill-defined, leaving open the possibility that the model will yield results that have no relation to real, physical features of the material. Moreover, continuity of derivatives is an important characteristic of any optical model subject to optimization in optical scatterometry. In particular, a discontinuity of derivatives may make the optimization process computationally unstable.

In some embodiments, the selected dispersion model includes a continuous Cody-Lorentz model having continuous first derivatives to describe the complex bulk band structure of high-K materials. The selected dispersion model includes a generalized Cody-Lorentz model to describe the complex bulk band structure of high-K dielectric materials augmented with additional Lorentz peaks to describe defects, interface states, or excitonic states. The generalized Cody-Lorentz model augmented with additional Lorentz peaks may be employed to model high-K dielectric layers and a variety of nanostructures (e.g., nanowires, quantum dots and quantum wells), including any number of bands of any origin, such as excitonic states. The model can be generalized to include any number of defect levels. In another example, the model can be applied to nanostructures (e.g., quantum wells, quantum dots and nanowires) embedded in another amorphous dielectric slab or layer. Additional description of the aforementioned modeling techniques is provided in U.S. Pat. Nos. 9,405,290, 9,595,481, and 9,664,734, the contents of which are incorporated herein by reference in their entirety.

In general, any suitable optical dispersion model may be contemplated within the scope of this patent document. By way of non-limiting example, a suitable dispersion model includes a BEMA model, a Cody-Lorentz model, a Tauc-Lorentz model, a harmonic oscillator model, and a point to point dispersion model.

Optical response function model 175 is received as input to fitting analysis module 177. The fitting analysis module 177 compares the modeled optical response with the corresponding measured data (e.g., measured spectra 102, measured spectra 103, or both) to determine values 104 of optical properties of the specimen, or values of both geometric and optical properties, which are stored in memory (e.g., memory 180). In some examples, fitting analysis module 177 resolves at least one optical parameter value by performing a fitting analysis on optical measurement data with the optical response model 175.

In some examples, a value of the band gap of the uniaxially strained FINFET channel measured parallel to the direction of extent of the channel, $E_{g0}$, and a value of the band gap of the uniaxially strained FINFET channel measured perpendicular to the direction of extent of the channel, $E_{g90}$, are determined by fitting analysis module 177. In addition, fitting analysis module 177 estimates the value of strain based on the values of the band gaps in accordance with equation (6).

The fitting of optical metrology data is advantageous for any type of optical metrology technology that provides sensitivity to parameters of interest. Specimen parameters can be deterministic (e.g., CD, SWA, etc.) or statistical (e.g., rms height of sidewall roughness, roughness correlation length, etc.) as long as proper models describing light interaction with the specimen are used.

In addition, in some embodiments, the one or more computing systems 130 are further configured to receive user input from a user input source such as a graphical user interface, keyboard, etc. The one or more computer systems are further configured to configure structural models of the semiconductor structures under measurement (e.g., structural model 172).

In general, optical scatterometry measurement data is sensitive to both the geometric features of the measured transistor structures and the optical properties of the underlying materials, including optical properties of the transistor channel affected by uniaxial strain. To estimate the state of strain of the transistor channel based on optical scatterometry measurements, the effect of strain on the measured spectra must be decorrelated from other contributors, such as the geometry of the measured metrology targets and material properties of other structures captured in the measurement (e.g., source and drain structures, etc.).

In a further aspect, the geometry of the metrology target under measurement is measured by another measurement system, and the measured geometry is fed forward into the optical scatterometry measurement model. For example, as depicted in FIGS. 2 and 3, a measurement source 150, such as an X-Ray based metrology system or an electron based metrology system is employed to accurately measure the geometry of the metrology target under measurement. The geometric profile 151 of the measured metrology target is fed forward to the structural model building module 171. In this manner, the structural model building module 171 generates a structural model 172 that accurately represents the geometry of the metrology target under measurement without unknown geometric parameters that must be floated in subsequent analysis by fitting analysis module 177. Exemplary measurement sources 150 include a transmissive small-angle x-ray scatterometer (T-SAXS), grazing incidence small-angle x-ray scatterometer (GI-SAXS), reflective small-angle x-ray scatterometer (R-SAXS), single wavelength ellipsometer, spectroscopic ellipsometer, transmission electron microscope, scanning electron microscope, etc.

In another further aspect, a trained geometric measurement model is employed to estimate the geometric profile of the metrology target under measurement based on the measured spectral signals (e.g., signals 102, 103, or both). The estimated geometric profile is fed forward into the optical scatterometry measurement model. In some embodiments, the estimated geometric profile of the measured metrology target is fed forward to the structural model building module 171, and the structural model building module 171 generates a structural model 172 that accurately represents the geometry of the metrology target under measurement without unknown geometric parameters that must be floated in subsequent analysis by the fitting analysis module 177. The trained geometric measurement model is a machine learning based model (e.g., neural network model, linear model, a polynomial model, a response surface model, a support vector machines model, random forest model, or other types of models). The machine learning based model is trained based on spectral signals collected from metrology targets having known geometric profiles, for example, geometric profiles accurately measured by a reference metrology system, such as the x-ray and electron based metrology systems described hereinbefore.

In a further aspect, material properties of the metrology target under measurement are directly measured by another measurement system, and the measured material properties are fed forward into the optical scatterometry measurement model. In one example, a reference metrology system is employed to measure the Germanium concentration or Carbide concentration present in the source and drain structures fabricated at either end of the channel structure. Exemplary reference metrology systems include an x-ray diffractometer, a RAMAN spectrometer, etc.

In some examples, the material concentrations of the metrology target structures under measurement are measured indirectly. In some examples, a thin film sample is fabricated under the same process conditions as the metrology target structures under measurement. The material concentrations of the thin film sample are measured. The measured material concentrations are fed forward to the optical scatterometry model as a proxy for the material concentrations of the metrology structures under measurement. Accurate measurements of material concentrations decorrelate their contribution to the spectral signals from the band gap measurement that is directly used to estimate the state of strain.

In another further aspect, a multi-model approach is employed to resolve the geometry of the metrology target under measurement and to provide a reference for the estimation of the absolute value of strain. Optical scatterometry measurements are performed on a metrology target pair including a strained metrology target and a corresponding unstrained metrology target.

Figure 5:
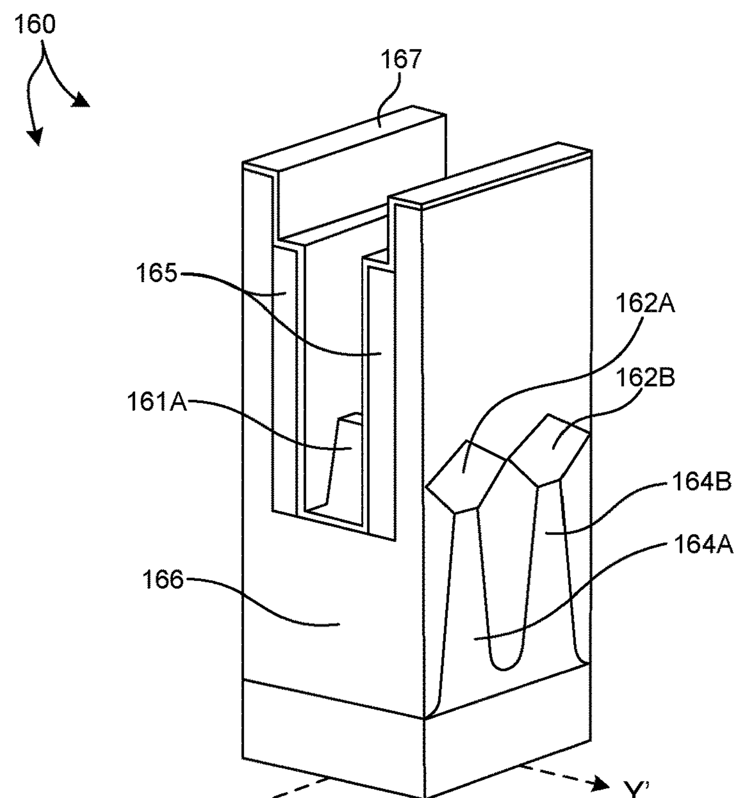
FIG. 5 depicts a metrology target including a repeating array of partially fabricated transistor structures in one embodiment.

FIG. 5 depicts a metrology target 160 including a repeating array of partially fabricated transistor structures. As depicted in FIG. 5, the array of transistor structures repeats in the X' direction. One transistor includes a source 162A, a drain (not visible in FIG. 5), and a channel 161A. A second transistor includes a source 162B, a drain (not visible in FIG. 5), and a channel (not visible in FIG. 5). Metrology target 160 includes an array of fin structures (e.g., fin structures 164A and 164B) that comprise the channels of each transistor. Silicon dioxide insulation material 166 isolates each transistor from one another. Spacers 165 and liner 167 isolate the gate (not shown) from the source and drain structures.

Figure 6:
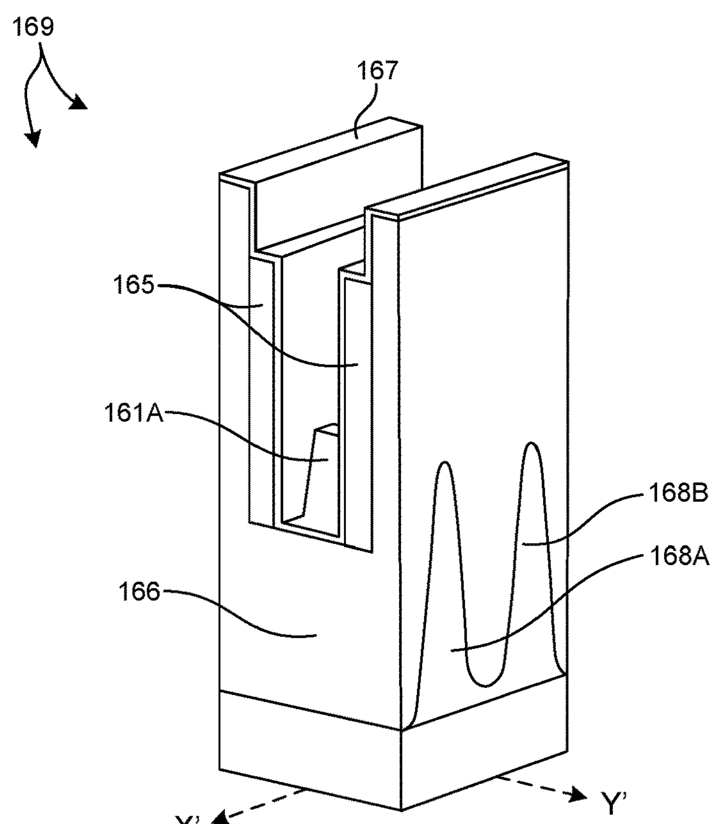
FIG. 6 depicts a metrology target including a repeating array of partially fabricated transistor structures in another embodiment.

FIG. 6 depicts another metrology target 169 including a repeating array of partially fabricated transistor structures. Metrology target 169 includes an array of fin structures (e.g., fin structures 168A and 168B) that comprise the channels of each transistor. As depicted in FIG. 6, the etch and epitaxial deposition steps that form the source and drain structures depicted in FIG. 5 have not yet been performed on metrology target 169. Otherwise, metrology targets 169 and 160 are the same.

Figure 8:
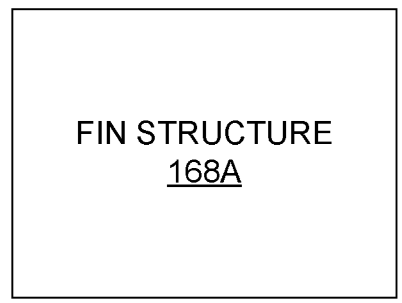
FIG. 8 depicts a cross sectional view of a fin structure of the metrology target depicted in FIG. 6.

FIG. 8 depicts a cross sectional view of fin structure 168A of metrology target 169 depicted in FIG. 6.

Figure 9:
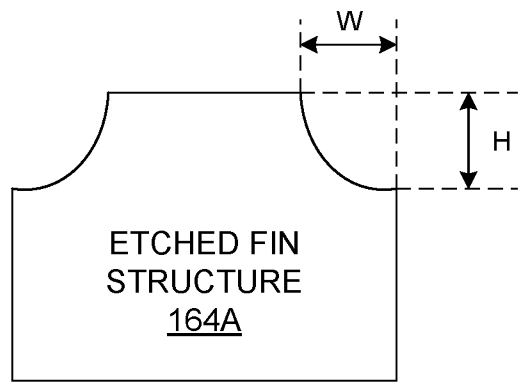
FIG. 9 depicts a cross-sectional view of a fin structure after an etch step is performed.

FIG. 9 depicts the same cross-sectional view of fin structure 164A after the etch step is performed. As depicted in FIG. 9, the corners of fin structure 168A are removed by the etch step. The height, H, and width, W, dimensions of the etched material are illustrated in FIG. 9.

Figure 10:
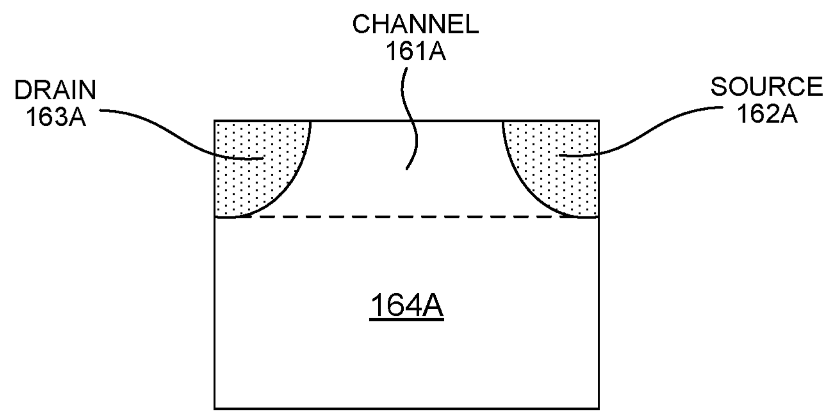
FIG. 10 depicts a cross sectional view of a fin structure after an epitaxial deposition step is performed.

FIG. 10 depicts the same cross-sectional view of fin structure 164A after the epitaxial deposition step is performed. As depicted in FIG. 10, the corners of fin structure 164A are filled with material that forms the source 162A and drain 163A structures of the transistor. Furthermore, the portion of fin structure 164A connecting the source and drain structures is the channel structure 161A of the transistor.

A transistor fabricated with a channel in a state of strain is fabricated with a fin structure made from a different material than the source and drain structures. In one example, fin structure 161A is fabricated with Silicon, and the source structure 162A and the drain structure 163A are fabricated with Silicon Germanium epitaxy (e.g., $Si_{1-x}Ge_x$). The lattice mismatch between these two different materials induces a compressive strain along the channel 161A. In this example, the Germanium concentration controls the degree of lattice mismatch, and therefore, influences the induced strain. In another example, fin structure 161A is fabricated with Silicon, and the source structure 162A and the drain structure 163A are fabricated with Silicon Carbide or Silicon doped with Phosphorous. The lattice mismatch between these two different materials induces a tensile strain along the channel 161A. In this example, the Carbide or Phosphorous concentration controls the degree of lattice mismatch, and therefore, influences the induced strain.

Figure 7:
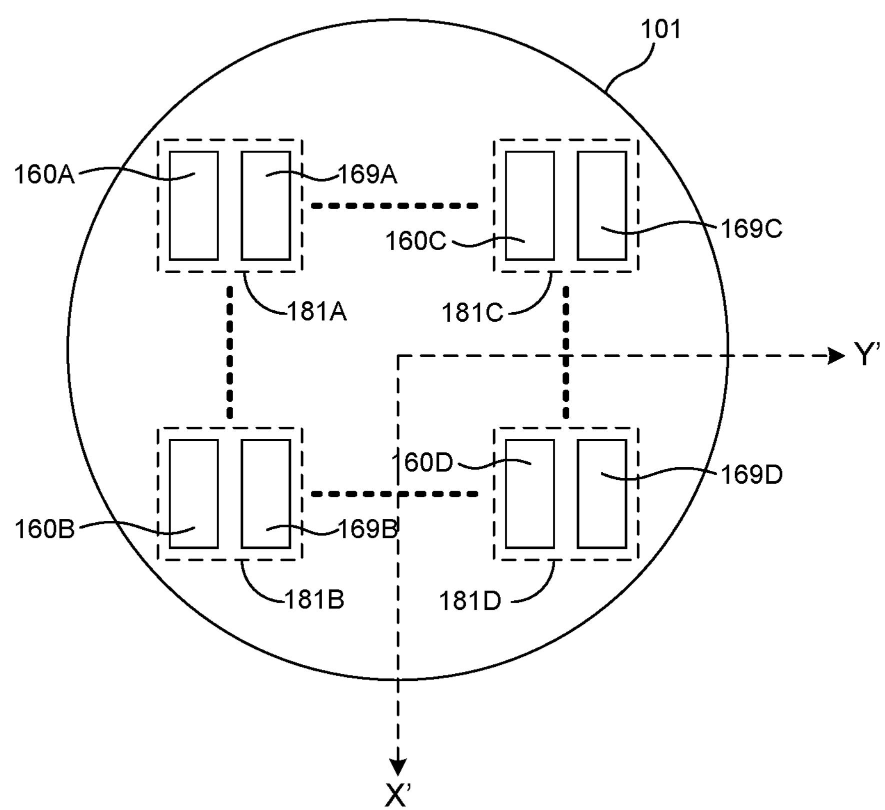
FIG. 7 depicts a Design of Experiments (DOE) wafer including a number of metrology target pairs in one embodiment.

In some embodiments, optical scatterometry measurements are performed on a metrology target pair including a strained metrology target and a corresponding unstrained metrology target. FIG. 7 depicts a Design of Experiments (DOE) wafer 101 including a number of metrology target pairs 181A-D. Each metrology target pair includes a strained target (e.g., targets 160A-D) and an unstrained target (e.g., targets 169A-D). The strained targets of each metrology target pair are manufactured with different source/drain material concentrations that induce difference values of strain in each of the fabricated channels.

In some embodiments, the strained metrology target is a metrology target, such as metrology target 160, fabricated with a fin structure made from a different material than the source and drain structures as described hereinbefore. In some of these embodiments, the unstrained metrology target is a partially fabricated metrology target, such as metrology target 169, where the fin is not etched and the source and drain structures are not fabricated. In these embodiments, the channel structure is unstrained because there is no lattice mismatch present at the ends of the channel structure (e.g., the entire fin structure is Silicon). In some other embodiments, the unstrained metrology target is a partially fabricated metrology target where the fin structure material is the same material used to fabricate the source and drain structures. Because the materials are the same, there is no lattice mismatch and no induced strain in the channel. By way of non-limiting example, the fin structure may be fabricated with Phosphorous doped SiGe or ternary Silicon Germanium Carbide (SiGeC). Although, some specific material mismatches are described to strain a transistor channel, in general, any material or method to strain a transistor channel may be contemplated within the scope of this patent document. Similarly, although, some specific materials are described to fabricate source, drain, and channel structures that do not result in strain of the transistor channel, in general, any material or method to grow channel, source, and drain structures that do not strain the transistor channel may be contemplated within the scope of this patent document.

In some embodiments, the measured spectra collected from the unstrained metrology target is processed by computing system 130 to solve for the geometric parameters that describe the geometry of the unstrained target. Since, the geometry of the strained and unstrained targets is the same, the geometry parameters determined based on measurements of the unstrained target are fed forward to the analysis of the optical parameters of the strained target. In this manner, the contributions to measured spectra from the geometric features are decorrelated from the contributions to measured spectra due to strain.

In some other embodiments, the measured spectra from both the unstrained and strained targets are processed by computing system 130 in a multi-target analysis. In this analysis, both the geometric parameters and the optical parameters are resolved in a combined analysis where geometric parameters for the strained and unstrained models are linked but the band gap and other related dispersion parameters that are affected by strain can vary independently.

In a further aspect, the measured spectra collected from the strained and unstrained metrology targets is processed by computing system 130 to solve for the band gap energy, $E_{g\text{-}strained}$, of the strained channel and for the band gap energy, $E_{g\text{-}unstrained}$, of the unstrained channel. In some embodiments, the optical scatterometry measurements of a transistor channel of both the strained and unstrained targets are performed at the same angle of the incident electric field with respect to the transistor channel (e.g., the incident electric field aligned with the direction of extent of the channel). The absolute value of strain in the strained channel is then determined based on the reference value of the band gap of the unstrained channel. In one example, the absolute value of strain along the channel is determined based on the model described by equation (2), where the change in the bandgap, ΔE, is the difference in the measured bandgap of the strained target, $E_{g0\text{-}strained}$, and the measured bandgap of the unstrained target, $E_{g0\text{-}unstrained}$. In addition, the strain in the perpendicular direction, $\varepsilon_{per}$, is approximately zero. Thus, the strain along the channel, $\varepsilon_{par}$, is computed in accordance with equation (7).

$$E_{g0\text{-}strained}-E_{g0\text{-}unstrained}=-5.658(2\varepsilon_{par})+3.837(\varepsilon_{par}) \quad (7)$$

In another further aspect, a trained strain measurement model is employed to estimate a relative value of strain of the transistor channel of a metrology target based on the measured spectral signals (e.g., signals 102, 103, or both). The trained strain measurement model is a machine learning based model (e.g., neural network model, linear model, a polynomial model, a response surface model, a support vector machines model, random forest model, or other types of models). The machine learning based model is trained based on spectral signals collected from metrology targets having known strain values, for example, strain values accurately measured by a reference metrology system.

In another further aspect, the value of strain in the channel of a semiconductor structure is correlated to electrical test results obtained from the finished device. A model of this correlation is subsequently used to predict the electrical performance of the finished device based on values of strain measured at an early stage of the manufacturing process.

In general, the techniques to break correlations among various contributors to the measured optical response described herein may be combined to improve the accuracy of strain measurement. For example, measurements of strained and unstrained targets can be analyzed sequentially or in parallel to accurately decorrelate geometry from the strain measurement. In addition, accurate measurements of geometry and material concentrations can also be employed to further refine the strain measurement.

In a further aspect, the wavelengths emitted by the illumination source (e.g., illumination sources 110 and 120) are selectable. In some embodiments, illumination source 110 or illumination source 120 is a LSP light source controlled by computing system 130 to maximize flux in one or more selected spectral regions. Laser peak intensity at the target material controls the plasma temperature and thus the spectral region of emitted radiation. Laser peak intensity is varied by adjusting pulse energy, pulse width, or both. As depicted in FIG. 2, computing system 130 communicates command signal 140 to illumination source 110 that causes illumination source 110 to adjust the spectral range of wavelengths emitted from illumination source 110. As depicted in FIG. 3, computing system 130 communicates command signal 141 to illumination source 120 that causes illumination source 120 to adjust the spectral range of wavelengths emitted from illumination source 120. In one example, illumination source 110, illumination source 120, or both, is a LSP light source, and the LSP light source adjusts any of a pulse duration, pulse frequency, and target material composition to realize a desired spectral range of wavelengths emitted from the LSP light source.

In some examples, the model building tool 170 reads a file that contains the equations of the structures that comprise the metrology target under measurement. In some examples, this file is generated by a lithography simulator such as PROLITH software available from KLA Corporation, Milpitas, Calif. (USA). Based on this application information the model building tool automatically sets the parameterization and constraints of the structural model.

Although the methods discussed herein are explained with reference to systems 100 and 200, any optical metrology system configured to illuminate and detect light scattered from a specimen may be employed to implement the exemplary methods described herein. Exemplary systems include an angle-resolved reflectometer (i.e., a beam profile reflectometer), an angle-resolved ellipsometer (i.e., beam profile ellipsometer), a scatterometer, a spectroscopic reflectometer or ellipsometer, a spectroscopic reflectometer or ellipsometer with multiple angles of illumination, a Mueller Matrix spectroscopic ellipsometer (e.g., a rotating compensator spectroscopic ellipsometer), a single wavelength ellipsometer, a single wavelength reflectometer, a RAMAN scatterometer, etc.

By way of non-limiting example, an ellipsometer may include a single rotating compensator, multiple rotating compensators, a rotating polarizer, a rotating analyzer, a modulating element, multiple modulating elements, or no modulating element.

It is noted that the output from a source and/or target measurement system may be configured in such a way that the measurement system uses more than one technology. In fact, an application may be configured to employ any combination of available metrology sub-systems within a single tool, or across a number of different tools.

A system implementing the methods described herein may also be configured in a number of different ways. For example, a wide range of wavelengths (including visible, ultraviolet, and infrared), angles of incidence, states of polarization, and states of coherence may be contemplated. In another example, the system may include any of a number of different light sources (e.g., a directly coupled light source, a laser-sustained plasma light source, etc.). In another example, the system may include elements to condition light directed to or collected from the specimen (e.g., apodizers, filters, etc.).

In general, the optical dispersion properties of semiconductor structures under measurement may be approximated as isotropic. Under this assumption the material parameters are scalar values. Alternatively, the optical dispersion properties of semiconductor structures under measurement may be more accurately modelled as anisotropic. Under this assumption, the material parameters will be a matrix of different values, rather than a scalar value. Additional details regarding the treatment of anisotropic structures under measurement is described in U.S. Patent Publication No. 2018/0059019, the content of which is incorporated herein by reference in its entirety.

Figure 13:
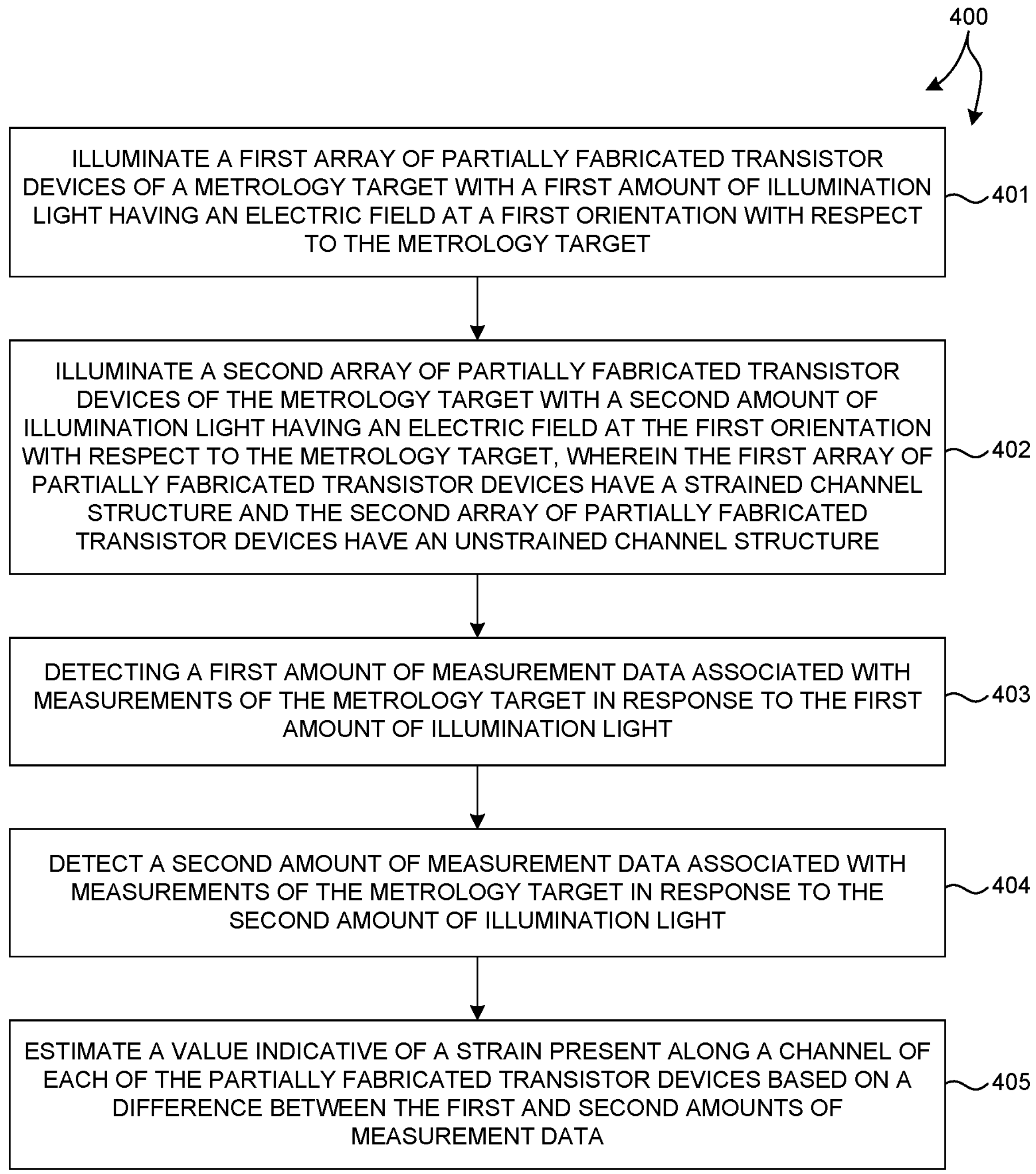
FIG. 13 is a flowchart illustrative of a method 400 for measuring strain in channel structures of partially fabricated transistor structures in one example as described herein.

FIG. 13 illustrates a method 400 suitable for implementation by the metrology systems 100 and 200 of the present invention. In one aspect, it is recognized that data processing blocks of method 400 may be carried out via a pre-programmed algorithm executed by one or more processors of computing system 130. While the following description is presented in the context of metrology systems 100 and 200, it is recognized herein that the particular structural aspects of metrology systems 100 and 200 do not represent limitations and should be interpreted as illustrative only.

In block 401, a metrology target including a first array of partially fabricated transistor devices is illuminated with a first amount of illumination light having an electric field at a first orientation with respect to the metrology target.

In block 402, a second array of partially fabricated transistor devices of the metrology target is illuminated with a second amount of illumination light having an electric field at the first orientation with respect to the metrology target. The first array of partially fabricated transistor devices have a strained channel structure, and the second array of partially fabricated transistor devices have an unstrained channel structure.

In block 403, a first amount of measurement data associated with measurements of the metrology target is detected in response to the first amount of illumination light.

In block 404, a second amount of measurement data associated with measurements of the metrology target is detected in response to the second amount of illumination light.

In block 405, a value indicative of a strain present along a channel of each of the partially fabricated transistor devices is estimated based on a difference between the first and second amounts of measurement data.

Figure 14:
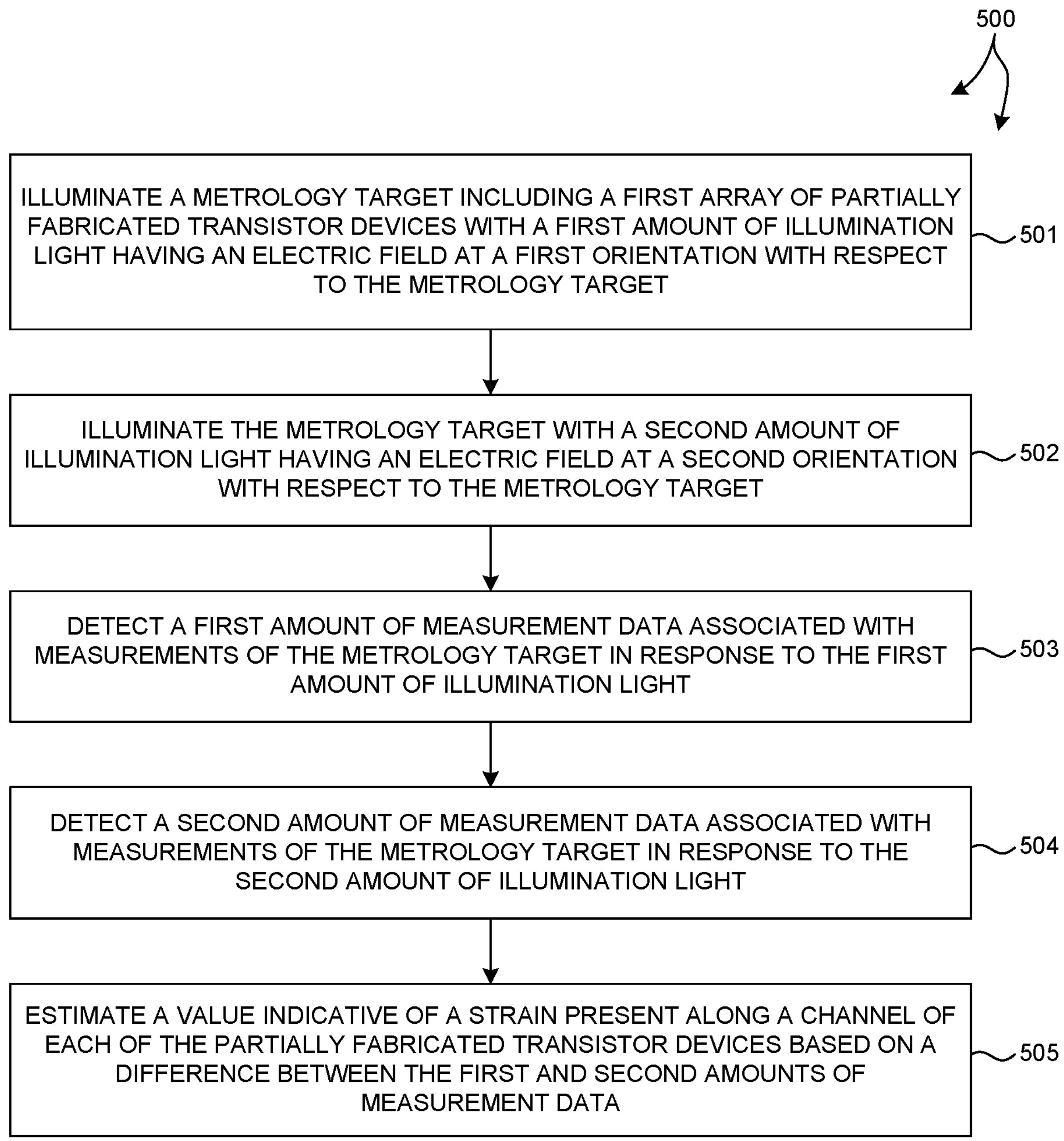
FIG. 14 is a flowchart illustrative of a method 500 for measuring strain in channel structures of partially fabricated transistor structures in another example as described herein.

FIG. 14 illustrates a method 500 suitable for implementation by the metrology systems 100 and 200 of the present invention. In one aspect, it is recognized that data processing blocks of method 500 may be carried out via a pre-programmed algorithm executed by one or more processors of computing system 130. While the following description is presented in the context of metrology systems 100 and 200, it is recognized herein that the particular structural aspects of metrology systems 100 and 200 do not represent limitations and should be interpreted as illustrative only.

In block 501, a first array of partially fabricated transistor devices of a metrology target is illuminated with a first amount of illumination light having an electric field at a first orientation with respect to the metrology target.

In block 502, the metrology target is illuminated with a second amount of illumination light having an electric field at a second orientation with respect to the metrology target.

In block 503, a first amount of measurement data associated with measurements of the metrology target is detected in response to the first amount of illumination light.

In block 504, a second amount of measurement data associated with measurements of the metrology target is detected in response to the second amount of illumination light.

In block 505, a value indicative of a strain present along a channel of each of the partially fabricated transistor devices is estimated based on a difference between the first and second amounts of measurement data.

It should be recognized that the various steps described throughout the present disclosure may be carried out by a single computer system, or, alternatively, multiple computer systems. Moreover, different subsystems of systems 100 and 200, such as the spectroscopic ellipsometer 105, may include a computer system suitable for carrying out at least a portion of the steps described herein. Therefore, the aforementioned description should not be interpreted as a limitation on the present invention but merely an illustration. Further, the one or more computing systems 130 may be configured to perform any other step(s) of any of the method embodiments described herein.

The computing system 130 may include, but is not limited to, a personal computer system, mainframe computer system, workstation, image computer, parallel processor, or any other computing device known in the art. In general, the term "computing system" may be broadly defined to encompass any device having one or more processors, which execute instructions from a memory medium. In general, computing system 130 may be integrated with a measurement system such as measurement systems 100 and 200, respectively, or alternatively, may be separate from any measurement system. In this sense, computing system 130 may be remotely located and receive measurement data and user input from any measurement source and user input source, respectively.

Program instructions 134 implementing methods such as those described herein may be transmitted over or stored on carrier medium. The carrier medium may be a transmission medium such as a wire, cable, or wireless transmission link. The carrier medium may also include a computer-readable medium such as a read-only memory, a random access memory, a magnetic or optical disk, or a magnetic tape. For example, as illustrated in FIGS. 2 and 3, program instructions 134 stored in memory 132 are transmitted to processor 131 over bus 133. Program instructions 134 are stored in a computer readable medium (e.g., memory 132). Exemplary computer-readable media include read-only memory, a random access memory, a magnetic or optical disk, or a magnetic tape.

As described herein, the term "critical dimension" includes any critical dimension of a structure (e.g., bottom critical dimension, middle critical dimension, top critical dimension, sidewall angle, grating height, etc.), a critical dimension between any two or more structures (e.g., distance between two structures), a displacement between two or more structures (e.g., overlay displacement between overlaying grating structures, etc.), and a dispersion property value of a material used in the structure or part of the structure. Structures may include three dimensional structures, patterned structures, overlay structures, etc.

As described herein, the term "critical dimension application" or "critical dimension measurement application" includes any critical dimension measurement.

As described herein, the term "metrology system" includes any system employed at least in part to characterize a specimen in any aspect. However, such terms of art do not limit the scope of the term "metrology system" as described herein. In addition, the metrology systems 100 and 200 may be configured for measurement of strain in patterned wafers and/or unpatterned wafers. The metrology system may be configured as a LED inspection tool, edge inspection tool, backside inspection tool, macro-inspection tool, or multimode inspection tool (involving data from one or more platforms simultaneously), and any other metrology or inspection tool.

Various embodiments are described herein for a semiconductor processing system (e.g., an inspection system or a lithography system) that may be used for processing a specimen. The term "specimen" is used herein to refer to a site, or sites, on a wafer, a reticle, or any other sample that may be processed (e.g., printed, measured, or inspected for defects) by means known in the art. In some examples, the specimen includes a single site having one or more measurement targets whose simultaneous, combined measurement is treated as a single specimen measurement or reference measurement. In some other examples, the specimen is an aggregation of sites where the measurement data associated with the aggregated measurement site is a statistical aggregation of data associated with each of the multiple sites. Moreover, each of these multiple sites may include one or more measurement targets associated with a specimen or reference measurement.

As used herein, the term "wafer" generally refers to substrates formed of a semiconductor or non-semiconductor material. Examples include, but are not limited to, monocrystalline silicon, gallium arsenide, and indium phosphide. Such substrates may be commonly found and/or processed in semiconductor fabrication facilities. In some cases, a wafer may include only the substrate (i.e., bare wafer). Alternatively, a wafer may include one or more layers of different materials formed upon a substrate. One or more layers formed on a wafer may be "patterned" or "unpatterned." For example, a wafer may include a plurality of dies having repeatable pattern features.

A "reticle" may be a reticle at any stage of a reticle fabrication process, or a completed reticle that may or may not be released for use in a semiconductor fabrication facility. A reticle, or a "mask," is generally defined as a substantially transparent substrate having substantially opaque regions formed thereon and configured in a pattern. The substrate may include, for example, a glass material such as amorphous $SiO_2$. A reticle may be disposed above a resist-covered wafer during an exposure step of a lithography process such that the pattern on the reticle may be transferred to the resist.

One or more layers formed on a wafer may be patterned or unpatterned. For example, a wafer may include a plurality of dies, each having repeatable pattern features. Formation and processing of such layers of material may ultimately result in completed devices. Many different types of devices may be formed on a wafer, and the term wafer as used herein is intended to encompass a wafer on which any type of device known in the art is being fabricated.

In one or more exemplary embodiments, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a general purpose or special purpose computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

Although certain specific embodiments are described above for instructional purposes, the teachings of this patent document have general applicability and are not limited to the specific embodiments described above. Accordingly, various modifications, adaptations, and combinations of various features of the described embodiments can be practiced without departing from the scope of the invention as set forth in the claims.

What is claimed is:

1. A metrology target pair, comprising:

a first periodic array of strained metrology target structures disposed on a wafer, each of the strained metrology target structures of the first periodic array having source, drain, and channel structures, wherein the dimensions of the source, drain, and channel structures of each of the strained metrology target structures of the first periodic array are the same dimensions as source, drain, and channel structures of a corresponding real transistor device structure further manufactured into a functioning electronic device, and wherein each of the strained metrology target structures of the first periodic array have a strained channel structure; and a second periodic array of unstrained metrology target structures disposed on the wafer, each of the unstrained metrology target structures of the second array having at least a channel structure, wherein a dimension of the channel structure of each of the unstrained metrology target structures of the second periodic array is the same dimension as the channel structure of the corresponding real transistor device structure, and wherein each of the unstrained metrology target structures of the second periodic array have an unstrained channel structure.

2. The metrology target pair of claim 1, wherein the real transistor device structure is a Fin Field Effect Transistor (FINFET) devices.

3. The metrology target pair of claim 1, wherein each of the unstrained metrology target structures of the second periodic array include a channel structure without an epitaxial source structure and an epitaxial drain structure fabricated at either end of the channel structure.

4. The metrology target pair of claim 1, wherein each of the unstrained metrology target structures of the second periodic array include an epitaxial source structure and an epitaxial drain structure at either end of the channel structure fabricated from the same material as the channel structure.

5. The metrology target pair of claim 1, wherein the channel structure of each of the strained metrology target structures of the first periodic array is fabricated with Silicon.

6. The metrology target pair of claim 5, wherein the source and drain structures of each of the strained metrology target structures of the first periodic array is fabricated with Silicon doped with Germanium, Phosphorous, Carbide, or any combination thereof.

7. The metrology target pair of claim 5, wherein the channel structure of each of the unstrained metrology target structures of the second periodic array is fabricated with Silicon doped with Germanium, Phosphorous, Carbide, or any combination thereof.

* * * * *